United States Patent
Lee et al.

(10) Patent No.: US 11,600,330 B2
(45) Date of Patent: Mar. 7, 2023

(54) MEMORY DEVICE FOR PERFORMING MULTI PROGRAM OPERATION AND OPERATING METHOD THEREOF

(71) Applicant: SK hynix Inc., Gyeonggi-do (KR)

(72) Inventors: Hyo Jae Lee, Gyeonggi-do (KR); Beom Ju Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 102 days.

(21) Appl. No.: 17/226,512

(22) Filed: Apr. 9, 2021

(65) Prior Publication Data
US 2022/0122667 A1 Apr. 21, 2022

(30) Foreign Application Priority Data
Oct. 16, 2020 (KR) .................. 10-2020-0134629

(51) Int. Cl.
*G11C 16/04* (2006.01)
*G11C 16/10* (2006.01)
*G06F 12/0815* (2016.01)

(52) U.S. Cl.
CPC .......... *G11C 16/10* (2013.01); *G06F 12/0815* (2013.01); *G11C 16/0483* (2013.01); *G06F 2212/1041* (2013.01)

(58) Field of Classification Search
CPC ............... G11C 16/10; G11C 16/0483; G11C 7/1087; G11C 7/20; G11C 11/5628; G11C 7/1057; G11C 7/106; G11C 7/1084; G11C 7/065; G11C 16/26; G06F 12/0815; G06F 2212/1041; G06F 2212/7203; G06F 12/0246; G06F 3/0659

USPC ...................................................... 365/185.12
See application file for complete search history.

(56) References Cited

U.S. PATENT DOCUMENTS

| 7,590,006 B2 * | 9/2009 | Tokiwa | G11C 16/3436 365/185.17 |
| 9,032,108 B2 * | 5/2015 | Lim | G11C 16/12 711/170 |
| 2011/0051514 A1 * | 3/2011 | Han | G11C 16/3459 365/185.09 |

FOREIGN PATENT DOCUMENTS

| KR | 10-2014-0134797 | 11/2014 |
| KR | 10-2016-0029215 | 3/2016 |

* cited by examiner

Primary Examiner — Tha-O H Bui
(74) Attorney, Agent, or Firm — IP & T Group LLP

(57) ABSTRACT

A memory device includes: a plurality of memory cells grouped into a plurality of planes; page buffer groups corresponding to respective ones of the plurality of planes, the page buffer groups including a plurality of page buffer circuits, each of the plurality of page buffer circuits including cache latches which are configured to receive data to be stored in memory cells in the plurality of planes; and control logic for controlling the page buffer groups to simultaneously initialize cache latches corresponding to at least two planes, among the cache latches, in response to a multi-plane program command, wherein the multi-plane program command instructs a multi-plane program operation of simultaneously storing data in plural planes among the plurality of planes.

20 Claims, 18 Drawing Sheets

MEMORY DEVICE FOR PERFORMING MULTI PROGRAM OPERATION AND OPERATING METHOD THEREOF

CROSS-REFERENCE TO RELATED APPLICATION

The present application claims priority under 35 U.S.C. § 119(a) to Korean patent application number 10-2020-0134629, filed on Oct. 16, 2020, with the Korean Intellectual Property Office, and which is incorporated herein by reference in its entirety.

BACKGROUND

Field of Invention

One or more embodiments described herein relate to a memory device and a method of operating a memory device.

Description of Related Art

A storage device stores data in a memory device under control of a host device, e.g., a computer or a smart phone. In some cases, the storage device may include a memory controller for controlling the memory device.

The memory device is classified into a volatile memory device or a nonvolatile memory device. A volatile memory device stores data only when power is supplied. The stored data disappears when the supply of power is interrupted. Examples of a volatile memory device include a Static Random Access Memory (SRAM) and a Dynamic Random Access Memory (DRAM). A nonvolatile memory device stores data even when the supply of power is interrupted. Examples of a nonvolatile memory device include a Read Only Memory (ROM), a Programmable ROM (PROM), an Electrically Programmable ROM (EPROM), an Electrically Erasable ROM (EEROM), a flash memory, and the like.

SUMMARY

In accordance with one or more embodiments, a memory device exhibits improved program operation speed. A method for operating a memory device with improved program operation speed is also provided.

In accordance with an aspect of the present disclosure, there is provided a memory device including: a plurality of memory cells grouped into a plurality of planes; page buffer groups corresponding to respective ones of the plurality of planes, the page buffer groups including a plurality of page buffer circuits, each of the plurality of page buffer circuits including cache latches which are configured to receive data to be stored in memory cells in the plurality of planes; and control logic configured to control the page buffer groups to simultaneously initialize cache latches corresponding to at least two planes, among the cache latches, in response to a multi-plane program command, wherein the multi-plane program command instructs a multi-plane program operation of simultaneously storing data in plural planes among the plurality of planes.

In accordance with another aspect of the present disclosure, there is provided a method for operating a memory device including a plurality of planes, the method including: receiving, from an external controller, a multi-plane program command instructing a multi-plane program operation and including a plurality of sub-commands, wherein the multi-plane program operation includes simultaneously performing program operations corresponding to respective ones of the plurality of planes; and simultaneously initializing, based on the plurality of sub-commands, a plurality of cache latches corresponding to the plurality of planes wherein the plurality of cache latches are configured to receive data to be stored in each of the plurality of planes.

In accordance with still another aspect of the present disclosure, there is provided a memory device including: a plurality of planes including memory cells; page buffer groups corresponding to respective ones of the plurality of planes, each of the page buffer groups being configured to receive data to be stored in the memory cells; and control logic configured to receive a multi-plane program command for simultaneously performing program operations on the plurality of planes, and control the page buffer groups to simultaneously initialize all latches included in the page buffer groups while receiving data to be stored in one plane among the plurality of planes.

BRIEF DESCRIPTION OF THE DRAWINGS

Example embodiments will be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Figure 1:
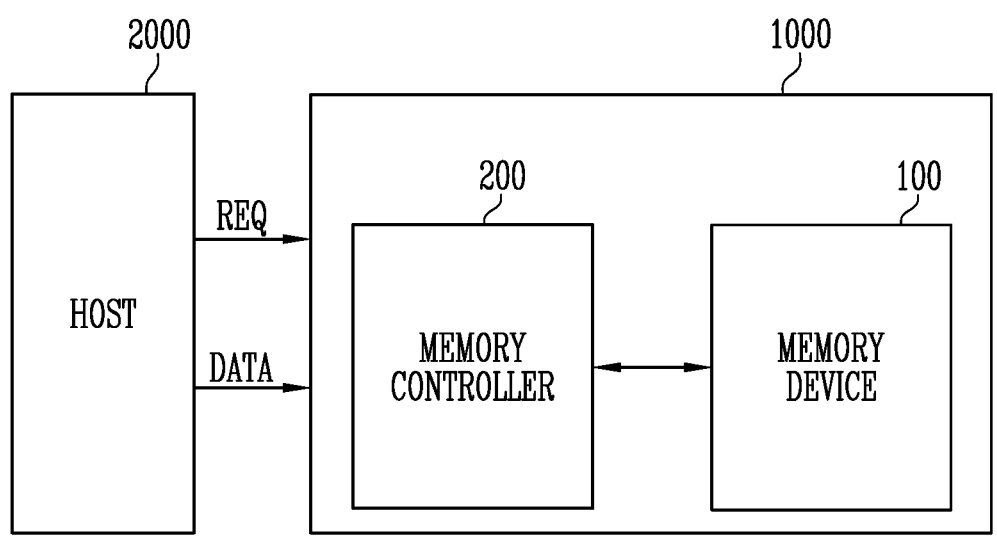
FIG. 1 illustrates an embodiment of a storage device.

FIG. 1 is a block diagram illustrating an embodiment of a storage device 1000 which may include a memory device 100 and a memory controller 200. The storage device 1000 may store data under control of a host 2000. Examples of the host 2000 include such as a mobile phone, a smart phone, an MP3 player, a laptop computer, a desktop computer, a game console, a display device, a tablet PC or an in-vehicle infotainment.

The storage device 1000 may be any of various types of storage devices, for example, according to a host interface that is a communication scheme with the host 2000. Examples of the storage device 1000 include a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), and a memory stick.

The storage device 1000 may be implemented as one of various kinds of package types. Examples include a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data or use stored data. The memory device 100 may operate under control of the memory controller 200. The memory device 100 may also include a plurality of memory dies, each of which may include a memory cell array including a plurality of memory cells for storing data. Each of the memory cells may be configured, for example, as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells, and one memory block may include a plurality of pages. In accordance with one embodiment, a page may be a unit for storing data in the memory device 100 or for reading data stored in the memory device 100.

The memory device 100 may be implemented, for example, as a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 may receive information including commands and addresses from the memory controller 200. The memory device 100 may then access areas corresponding to the received addresses in the memory cell array. Accessing memory areas in the memory device may mean, for example, that memory device 100 performs an operation corresponding to received commands on areas selected by the addresses. For example, the memory device 100 may perform a write operation (program operation), a read operation, and an erase operation. In the program operation, the memory device 100 may record data in an area selected by an address. In a read operation, the memory device 100 may read data from an area selected by an address. In an erase operation, the memory device 100 may erase data stored in an area selected by an address.

Each of a plurality of memory dies included in the memory device 100 may include at least one memory cell array. The plurality of memory dies may be controlled, for example, through a die interleaving operation, a channel interleaving operation, a way interleaving operation, a plane interleaving operation, or another operation.

When power is applied to the storage device 1000, the memory controller 200 may execute instructions, e.g., firmware (FW). The FW may include a Host Interface Layer (HIL) which receives a request input from the host 2000 or outputs a response to the host 2000, a Flash Translation Layer (FTL) which manages an operation between an interface of the host 2000 and an interface of the memory device 100, and a Flash Interface Layer (FIL) which provides a command to the memory device 100 or receives a response from the memory device 100.

The memory controller 200 may receive data and a Logical Address (LA) from the host 2000 and may translate the LA into a Physical Address (PA) representing an address of memory cells in which data in the memory device 100 is to be stored. In one embodiment, the LA may be a Logical Block Address (LBA), and the PA may be a Physical Block Address (PBA).

The memory controller 200 may control the memory device 100 to perform a program operation, a read operation, an erase operation, or another operation, in response to a request from the host 2000. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

The memory controller 200 may control the memory device 100 to autonomously perform a program operation, a read operation, or an erase operation regardless of any request from the host 2000. For example, the memory controller 200 may control the memory device 100 to perform a program operation, a read operation, or an erase operation, which may be used to perform a background operation such as wear leveling, garbage collection, read reclaim, or another operation.

In accordance with an embodiment, the memory controller 200 may provide a multi-plane program command to the memory device 100. When the memory device 100 receives the multi-plane program command, the memory device 100 may initialize a cache latch, based on the received command and an address, and receive data input to the initialized cache latch. Also, the memory device 100 may perform a multi-plane program operation, based on the command, the address, and the data.

The host 2000 may communicate with the storage device 1000 using at least one of various communication standards or interfaces. Examples include a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
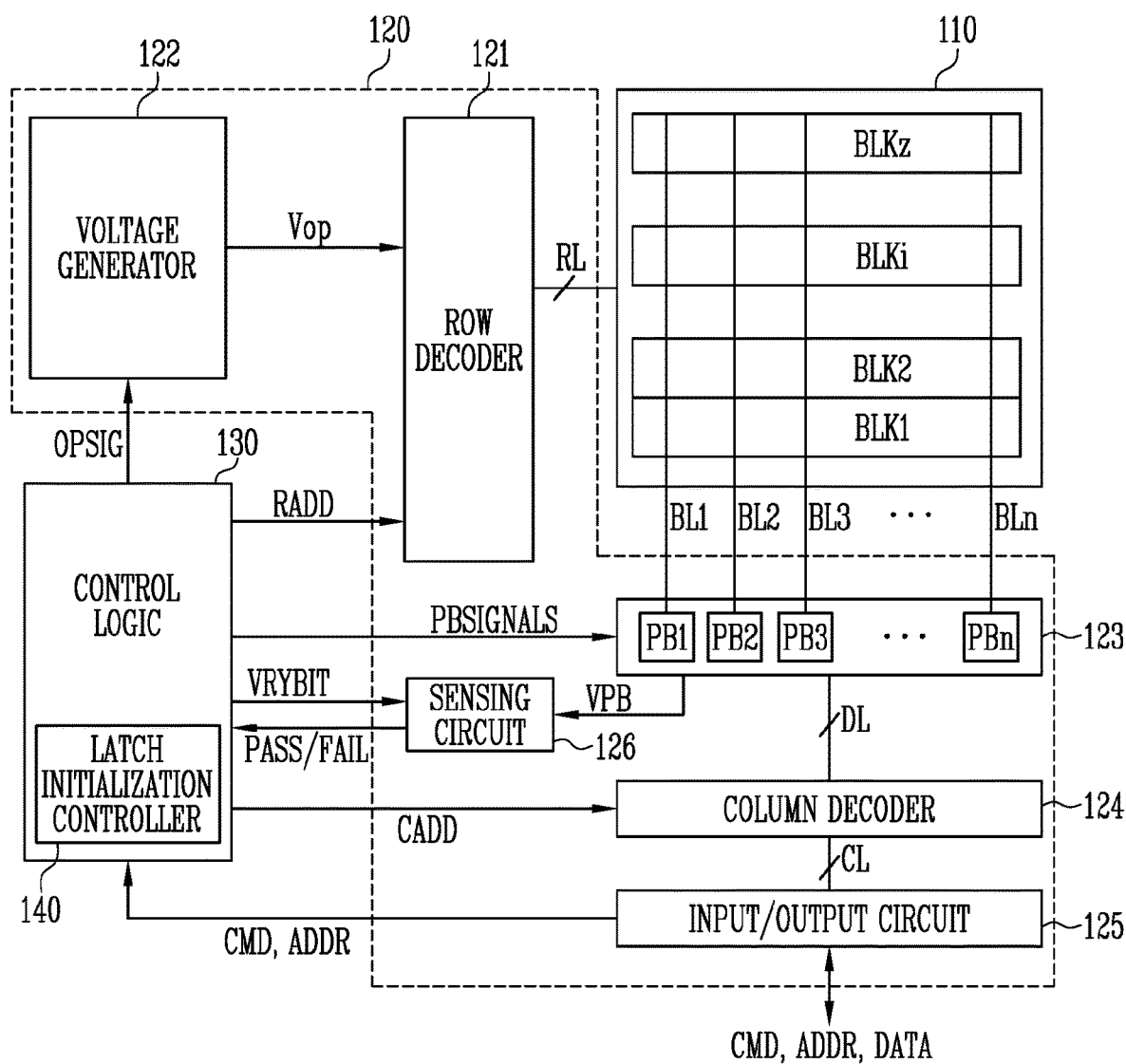
FIG. 2 illustrates an embodiment of a memory device.

FIG. 2 is a block diagram illustrating an embodiment of the memory device 100, which may include a memory cell array 110, a peripheral circuit 120, and a control logic 130. The memory cell array 110 includes a plurality of memory blocks BLK1 to BLKz connected to a row decoder 121 through row lines RL. The row lines RL may include at least one source select line, a plurality of word lines, and at least one drain select line. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

Each of the memory cells in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may be configured to perform a program operation, a read operation or an erase operation on a selected area of the memory cell array 110 under the control of the control logic 130. For example, the peripheral circuit 120 may drive the memory cell array 110 under the control of the control logic 130. In one embodiment, peripheral circuit 120 may apply one or more operating voltages to the row lines RL and the bit lines BL1 to BLn or discharge the applied voltages under control of the control logic 130.

The peripheral circuit 120 may include, for example, row decoder 121, a voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of control logic 130 and may receive a row address RADD from the control logic 130. The row decoder 121 may then decode the row address RADD, and may then select at least one memory block among the memory blocks BLK1 to BLKz according to the decoded address. Also, the row decoder 121 may select at least one word line of the selected memory block, to apply voltages generated by the voltage generator 122 to the at least one word line WL according the decoded address.

For example, in a program operation, the row decoder 121 may apply a program voltage to the selected word line and may apply a program pass voltage (having a level different from (e.g., lower than) that of the program voltage to unselected word lines. In a program verify operation, the row decoder 121 may apply a verify voltage to the selected word line and may apply a verify pass voltage (e.g., higher than the verify voltage) to the unselected word lines. In a read operation, the row decoder 121 may apply a read voltage to the selected word line and may apply a read pass voltage higher than the read voltage.

In an embodiment, an erase operation of memory device 100 may be performed in a memory block unit. In the erase operation, row decoder 121 may select one memory block according to the decoded address. In the erase operation, the row decoder 121 may apply a reference (e.g., ground) voltage to word lines connected to the selected memory block.

The voltage generator 122 may operate under the control of the control logic 130. For example, voltage generator 122 may generate a plurality of voltages using an external power voltage supplied to memory device 100, under the control of the control logic 130. In one embodiment, the voltage generator 122 may generate a program voltage, a verify voltage, a pass voltage, a read voltage, an erased voltage, and/or another voltage under control of the control logic 130. That is, the voltage generator 122 may generate various operating voltages Vop used in program, read, and erase operations in response to an operation signal OPSIG.

In an embodiment, the voltage generator 122 may generate an internal power voltage by regulating the external power voltage. The internal power voltage generated by the voltage generator 122 may be used as an operation voltage of the memory cell array 110.

In an embodiment, the voltage generator 122 may generate a plurality of voltages using the external power voltage or the internal power voltage. For example, the voltage generator 122 may include a plurality of pumping capacitors for receiving the internal power voltage, and may generate the plurality of voltages by selectively activating the plurality of pumping capacitors under the control of the control logic 130. In addition, the plurality of generated voltages may be supplied to the memory cell array 110 by the row decoder 121.

The page buffer group 123 may include first to nth page buffers PB1 to PBn. The first to nth page buffers PB1 to PBn may be connected to the memory cell array 110 respectively through first to nth bit lines BL1 to BLn. Also, the first to nth bit lines BL1 to BLn may operate under the control of the control logic 130. For example, the first to nth bit lines BL1 to BLn may operate in response to page buffer control signals PBSIGNALS. In one embodiment, the first to nth page buffers PB1 to PBn may temporarily store data received through the first to nth bit lines BL1 to BLn or may sense a voltage or current of the bit lines BL1 to BLn in a read or verify operation.

In one embodiment, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page may be programmed according to the transferred data DATA. A memory cell connected to a bit line to which a program allow voltage (e.g., a ground voltage) is applied may have an increased threshold voltage. A threshold voltage of a memory cell connected to a bit line, to which a program inhibit voltage (e.g., a power voltage) is applied, may be maintained.

In a program verify operation, the first to nth page buffers PB1 to PBn may read page data from the selected memory cells through the first to nth bit lines BL1 to BLn.

In a read operation, the first to nth page buffers PB1 to PBn may read data DATA from the memory cells of the selected page through the first to nth bit lines BL1 to BLn, and may output the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example, the column decoder 124 may communicate data with the first to nth page buffers PB1 to PBn through data lines DL, or may communicate data with the input/output circuit 125 through column lines CL.

The input/output circuit 125 may transfer a command CMD and an address ADDR, received from the memory controller 200, to the control logic 130 or may exchange data DATA with the column decoder 124.

In a read operation or verify operation, the sensing circuit 126 may generate a reference current in response to an allow bit VRYBIT signal and may output a pass PASS or a fail FAIL signal. The pass PASS or fail FAIL signal may be output based on a comparison of a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. In accordance with an embodiment, the control logic 130 may control the page buffer group 123 to initialize a cache latch in the page buffer group 123 using the page buffer control signals PBSIGNALS. The cache latch may be, for example, a latch which receives data to be stored in a memory cell.

Also, the control logic 130 may determine whether the verify operation has passed or failed in response to the pass or fail signal PASS or FAIL. The control logic 130 may also control the page buffer group 123 to temporarily store verify information including the pass or fail signal PASS or FAIL in the page buffer group 123. For example, the control logic 130 may determine a program state of a memory cell in response to the pass or fail signal PASS or FAIL. In one embodiment, when the memory cell operates as a Triple Level Cell (TLC), the control logic 130 may determine whether the program state of the memory cell is any one of an erase state E or first to seventh program states P1 to P7.

Also, the control logic 130 may include a latch initialization controller 140 which may determine a target latch to perform an initialization operation based on a plurality of sub-commands, and which may control the page buffer group 123 to initialize the determined target latch. Also, the latch initialization controller 140 may control the page buffer group 123 to move data stored in one latch to another latch connected to the same bit line. Other features will be described with reference to FIG. 10.

Figure 3:
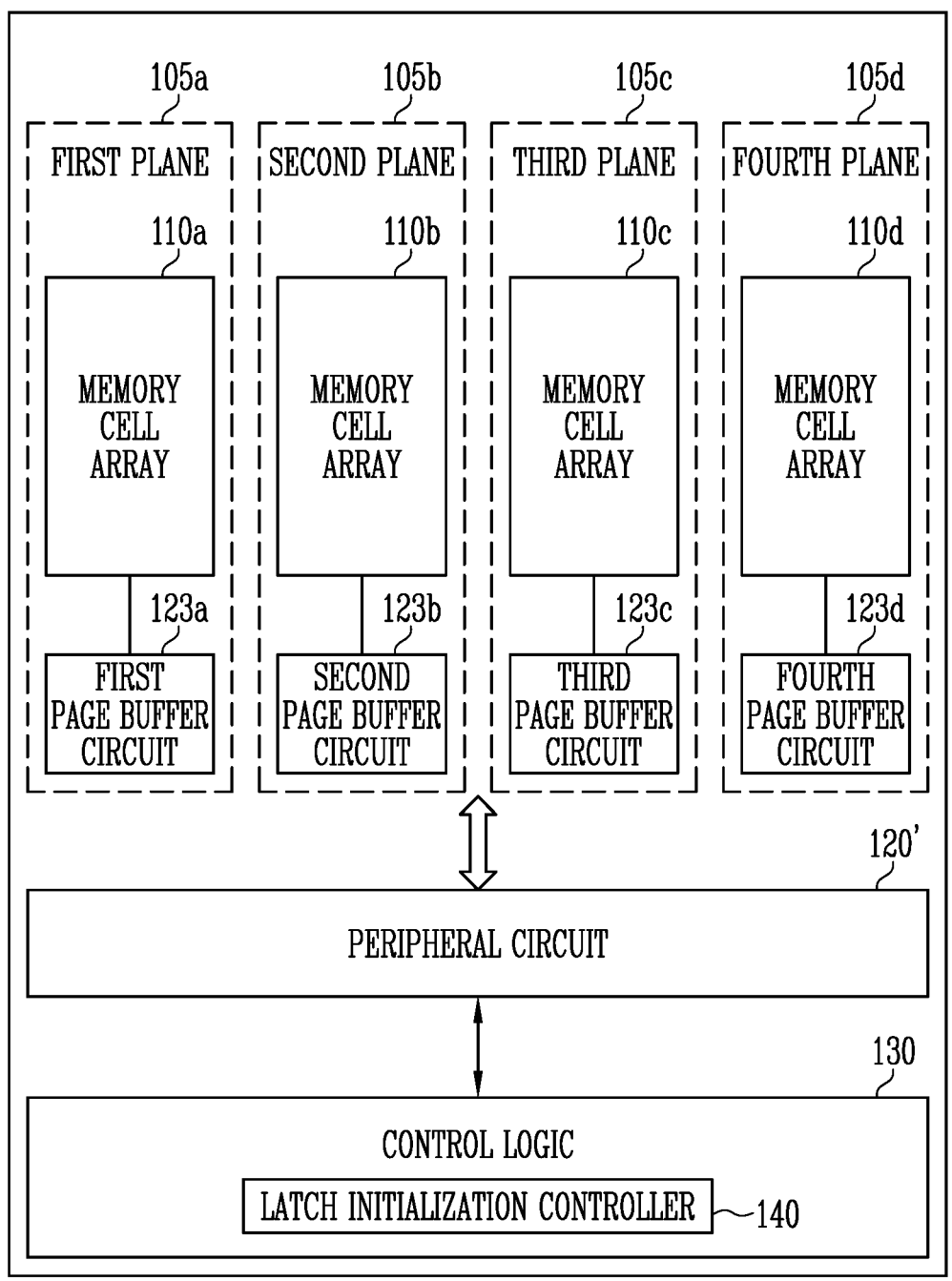
FIG. 3 illustrates an embodiment of a memory device.

FIG. 3 is a block diagram illustrating an embodiment of memory device 100, which includes first to fourth planes 105a to 105d, a peripheral circuit 120, and a control logic 130.

A memory cell array 110 and a page buffer group 123 may be divided into memory cell arrays and page buffer circuits, each of which are connected to the same bit line. For example, the memory cell array 110 and the page buffer group 123 may form a pair to operate in one plane unit. In one embodiment, a first memory cell array 110a and a first page buffer circuit 123a may form a pair to operate in a plane unit, a second memory cell array 110b and a second page buffer circuit 123b may form a pair to operate in a plane unit, a third memory cell array 110c and a third page buffer circuit 123c may form a pair to operate in a plane unit, and a fourth memory cell array 110d and a fourth page buffer circuit 123d may form a pair to operate in a plane unit. The memory cell array 110 and the page buffer circuit 123, included in the memory device 100, may be divided into a plurality pairs of memory cell arrays and page buffer circuits, which correspond to each other. Each of the pairs may independently operate in a plane unit.

The peripheral circuit 120' may include a row decoder 121, a voltage generator 122, a column decoder 124, an input/output circuit 125, a sensing circuit 126, and/or other features. Like the peripheral circuit 120 shown in FIG. 2, the peripheral circuit 120' may be configured to perform a program operation, a read operation, or an erase operation on a selected area of the memory cell array 110 under control of the logic circuit 130 or a latch initialization controller 140. In one embodiment, the peripheral circuit 120' may drive the first to fourth memory cell array 110a to 110d under the control of the control logic 130 or the latch initialization controller 140. For example, the peripheral circuit 120' may apply various operating voltages to row lines RL and bit lines BL1 to BLn or discharge the applied voltages under the control of the control logic 130.

Figure 4A:
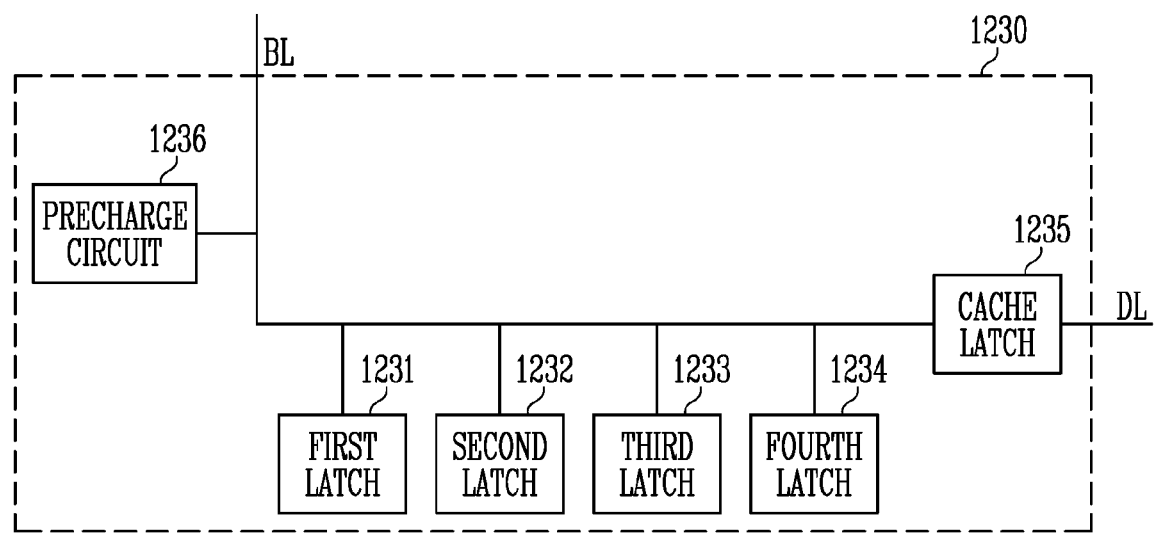
FIG. 4A illustrates an embodiment of a page buffer circuit.

FIG. 4A is a diagram illustrating an embodiment of a page buffer circuit which may include a first latch 1231, a second latch 1232, a third latch 1233, a fourth latch 1234, a cache latch 1235, and a precharge circuit 1236. Also, the page buffer circuit 1230 may be any one page buffer PBi among the page buffers PB1 to PBn shown in FIG. 2 or 3.

The page buffer circuit 1230 may be connected to the memory cell array 110 through a bit line BL and may operate under control of the control logic 130 in a program operation. For example, the page buffer circuit 1230 may perform a cache latch initialization operation or an operation of moving data between latches. Also, the page buffer circuit 1230 may exchange data with the column decoder through a data line DL.

The first latch 1231 may store precharge data used to determine a voltage at which the bit line BL is precharged or may store sensing data sensed from the bit line BL. Data sensed from the bit line BL in the first latch 1231 may be transferred to the sensing circuit 126. The sensed data may be, for example, a sensing voltage VPB or a sensing current IPB. The sensing circuit 126 may generate a reference current in response to an allow bit signal VRYBIT and may output verify information by comparing the sensing voltage VPB received from the page buffer circuit 1230 with a reference voltage generated by the reference current. The verify information may include main verify information on a main verify voltage and pre-verify information on a pre-verify voltage. Also, the verify information may represent a pass signal PASS or a fail signal FAIL based on a comparison of a threshold voltage of a memory cell with the main verify voltage or the pre-verify voltage.

The second to fourth latches 1232 to 1234 may be connected to a memory cell belonging to the same plane through the bit line BL. The second to fourth latches 1232 to 1234 may temporarily store data to be programmed in the memory cell. For example, a plurality of logical pages to be stored in the memory cell may be stored in second to fourth latches 1232 to 1234. In one embodiment, the second to fourth latches 1232 to 1234 may store data corresponding to a Most Significant Bit (MSB) page, a Center Significant Bit (CSB) page, and a Least Significant Page (LSB) page.

The cache latch 1235 may be connected to the data line DL and may receive data input from an external source. For example, the cache latch 1235 may receive data to be stored in memory cells. In accordance with an embodiment, the cache latch 1235 may be initialized before the data is input. The cache latch 1235 may receive data input from an external source. The cache latch 1235 may receive data without performing initialization of the cache latch 1235, or may store erroneous data in the memory device 100 when an error occurs in the input data during performance of a program operation. Therefore, an initialization operation of the cache latch may be performed.

In addition, control logic 130 may control the page buffer circuit 1230 to move the data (input from an outside source to the cache latch 1235) to at least one latch among the second to fourth latches 1232 to 1234. In accordance with an embodiment, the cache latch 1235 may receive LSB data corresponding to the LSB page and may move the LSB data to any one latch among the second to fourth latches 1232 to 1234 under the control of the control logic 130.

The precharge circuit 1236 may precharge the bit line using any one of a program allow voltage and a program inhibit voltage under the control of the control logic 130. In one embodiment, the precharge circuit 1236 may precharge the bit line by using a double program voltage.

Although a case where the first to fourth latches 1231 to 1234 are included in the page buffer circuit 1230 shown in FIG. 4A has been illustrated, this is for convenience of description. A different number of latches may be included in the page buffer circuit 1230 in another embodiment.

Figure 4B:
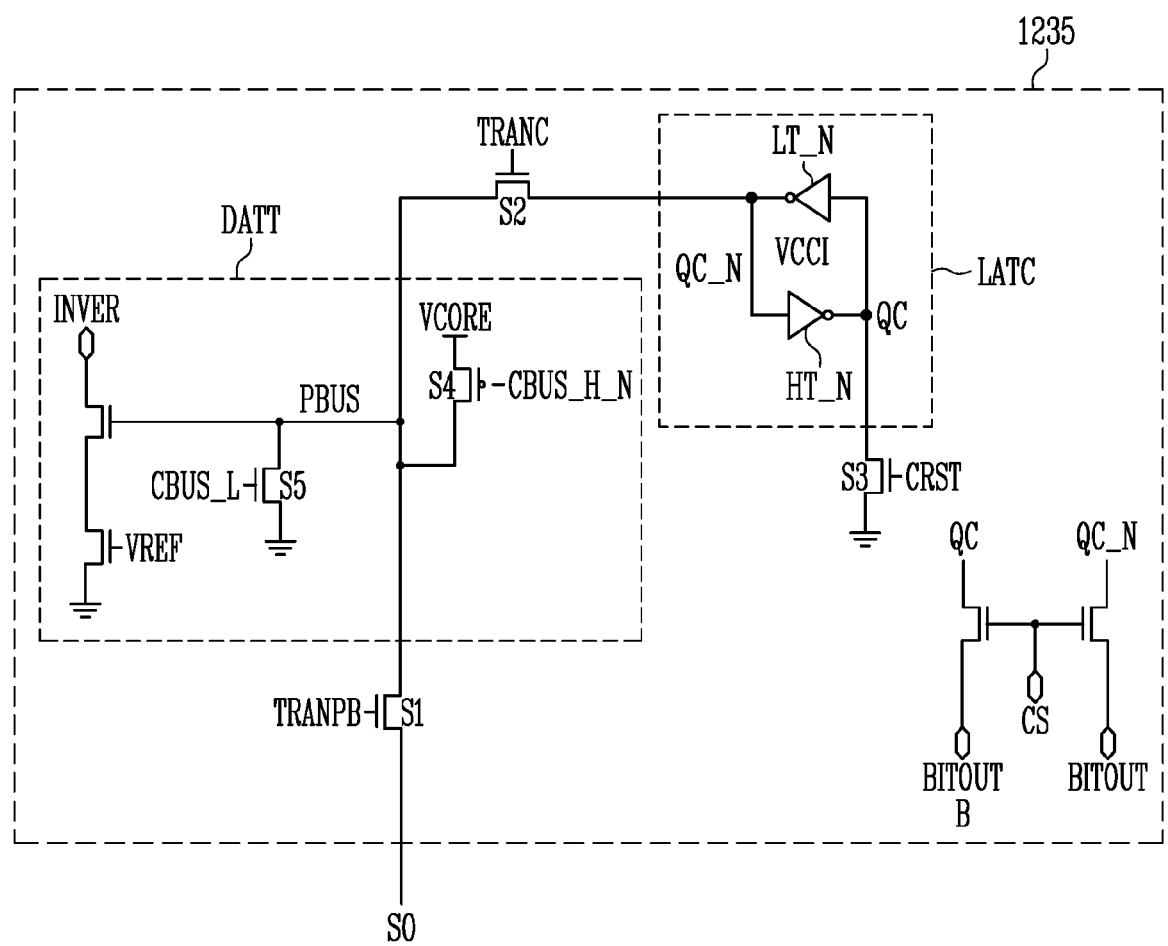
FIG. 4B illustrates an embodiment of a cache latch.

FIG. 4B is a diagram illustrating an embodiment of the cache latch 1235, which may include first to fourth switches S1 to S4, a data transmission circuit DATT and a latch circuit LATC. The first switch S1 may be configured as an NMOS transistor which connects a sensing node SO and a page bus node PBUS to each other in response to a page data transmission signal TRANPB. The second switch S2 may be configured as an NMOS transistor which connects the page bus node PBUS and a first cache node QC_N to each other in response to a cache data transmission signal TRANC. The data transmission circuit DATT may include the fourth switch S4 and a fifth switch S5, which are connected in series to each other between a power voltage VCORE terminal and a reference (e.g., ground) terminal. The fourth transistor S4 may be configured as a PMOS transistor which operates in response to a first bus signal CBUS_H_N. The fifth switch S5 may be configured as an NMOS transistor which operates in response to a second bus signal CBUS_L.

The page bus node PBUS is connected between the fourth switch S4 and the fifth switch S5. The latch circuit LATC may include first and second inverters HT_N and LT_N. An input terminal of the first inverter HT_N may be connected to the first cache node QC_N, and an output terminal of the first inverter HT_N may be connected to a second cache node QC. The second inverter LT_N may include an input terminal connected to the second cache node QC and an output terminal connected to the first cache node QC_N. The third switch S3 may be configured as an NMOS transistor which can reset a potential of the second cache node QC to a low level in response to a cache reset signal CRST. In another embodiment, the transistors may be implemented using one or more transistors of different conductivities than indicated above.

Figure 5:
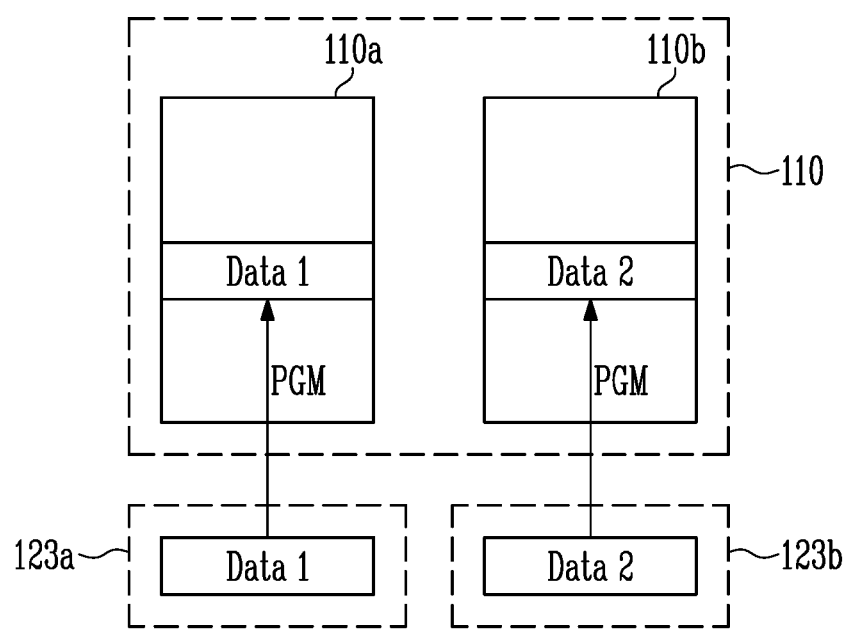
FIG. 5 illustrates an embodiment of a multi-plane program operation.

FIG. 5 is a diagram illustrating an embodiment of a multi-plane program operation. Referring to FIG. 5, a memory cell array 110, a first page buffer circuit 123a, and a second page buffer circuit 123b are illustrated. A plurality of pages included in a first memory cell array 110a and a second memory cell array 110b may be simultaneously programmed, e.g., the first memory cell array 110a and the second memory cell array 110b may be simultaneously programmed.

In one embodiment, in the multi-plane program operation, the memory device 100 may receive a multi-plane program command from the memory controller 200. The multi-plane program command may include a plurality of sub-commands, and the plurality of sub-commands may include address information representing which plane (among a plurality of planes) data to be input is to be stored in. The plurality of sub-commands may include logical page information representing which logical page among a plurality of logical pages data to be input corresponds to.

In addition, the memory device 100 may store data received from an external device (e.g., the host) in a page buffer group 123 corresponding to the plurality of sub-commands. For example, first data and second data may respectively correspond to a first plane and a second plane, and the memory device 100 may store the first data and the second data in respective ones of the first page buffer circuit 123a and the second page buffer circuit 123b.

Also, the memory device 100 may simultaneously program the data stored in the page buffer group 123 to a memory cell array corresponding to each plane. For example, the memory device 100 may apply a program pulse to a corresponding word line in order to simultaneously program the first data and the second data (which are respectively stored in the first page buffer circuit 123a and the second page buffer circuit 123b) to the first memory cell array 110a and the second memory cell array 110b.

Since data is simultaneously stored in a memory cell array 110 corresponding to each plane, the total program time can be decreased.

Figure 6:
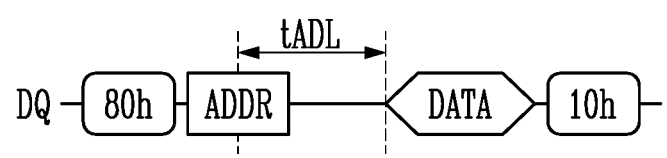
FIG. 6 illustrates an embodiment of an address cycle to data loading time in a program operation.

FIG. 6 is a timing diagram illustrating an embodiment of an address cycle-to-data loading time in a program operation. Referring to FIG. 6, in the timing diagram, a command, an address, and data are sequentially input to the memory device 100. The label 80h may be indicative of a program command for performing a program operation of storing data, and ADDR may be indicative of address information representing to a target of a program operation corresponding to the program command. In addition, DATA is data input from an external device (e.g., the host) and may correspond to data to be stored in the memory device 100. The label 10h may be indicative of a confirm command for checking the last of a command-address-data sequence.

The memory device 100 may sequentially receive the program command, the address, the data, and the confirm command. For example, the memory device 100 may receive the program command (e.g., 80h) from an external controller (e.g., the memory controller 200) and then may receive the address information representing to a target of the program operation. Also, the memory device 100 may receive the data to be stored in the memory device 100 and the confirm command, and then may perform the program operation on a selected memory cell.

Before the memory device 100 receives the data from the external device, the memory device 100 may perform an initialization operation of initializing a cache latch for receiving data, in order to prevent an error from occurring in the input data. The operation of initializing the cache latch may be performed in an Address cycle to Data Loading time tADL. When the cache latch is connected to the data line DL as described in FIG. 4A, data is to be input to the page buffer circuit through the cache latch. When an error occurs in data input to the cache latch, data may be programmed which is different from that which the host intends to transfer. Therefore, the cache latch may be initialized before the cache latch receives data.

Figure 7:
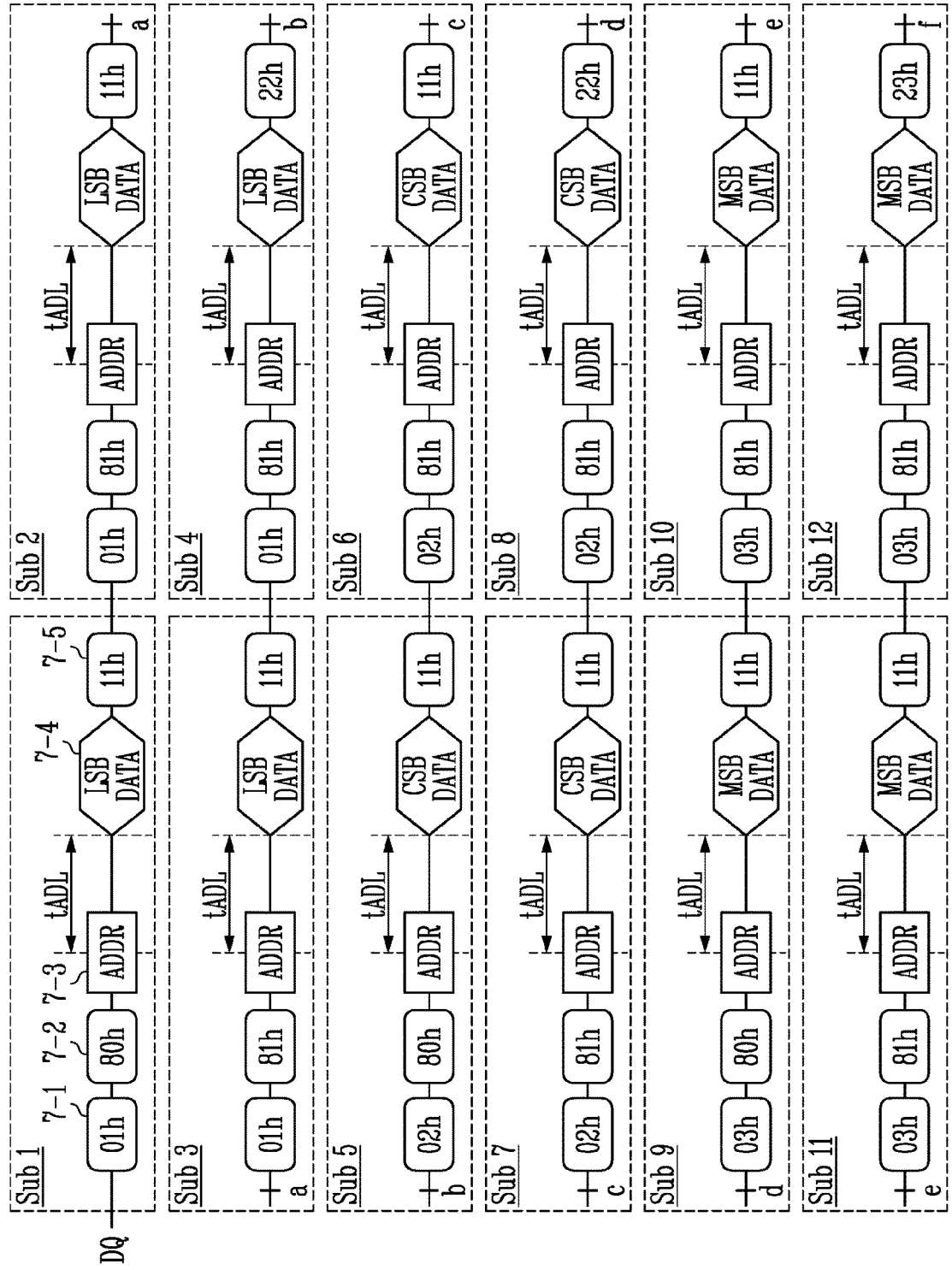
FIG. 7 illustrates an embodiment of a multi-plane program operation.

FIG. 7 is a timing diagram illustrating an embodiment of a multi-plane program operation. Referring to FIG. 7, the timing diagram corresponds to a multi-plane program command, including first to twelfth sub-commands Sub 1 to Sub 12 input to the memory device 100. In one embodiment, a sub-command may be one unit which constitutes a multi-program command and, for example, which includes a command, an address, and data corresponding to one plane. In another embodiment, the multi-program command may have a different number of sub-commands.

The memory device 100 may sequentially receive the first to twelfth sub-commands Sub 1 to Sub 12. The sub-commands may correspond to a plurality of planes. For example, the first sub-command Sub 1, the fifth sub-command Sub 5, and the ninth sub-command Sub 9 may correspond to a first plane, the second sub-command Sub 2, the sixth sub-command Sub 6, and the tenth sub-command Sub 10 may correspond to a second plane, the third sub-command Sub 3, the seventh sub-command Sub 7, and the eleventh sub-command Sub 11 may correspond to a third plane, and the fourth sub-command Sub 4, the eighth sub-command Sub 8, and the twelfth sub-command Sub 12 may correspond to a fourth plane.

In one embodiment, one sub-command may include information representing that the one sub-command is a multi-plane command, logical page information representing which logical page among a plurality of logical pages data to be input corresponds to, and address information representing which plane among a plurality of planes data to be input is data to be stored in.

Referring to a sequence of each sub-command, memory device 100 may receive a command representing the multi-plane program operation, and may receive an address corresponding to the received command. Also, the memory device 100 may perform an initialization operation which includes initializing a cache latch during an address cycle-to-data loading time tADL before data is input. For example, a sequence of all the sub-commands may include the address cycle-to-data loading time tADL as a period of initialization of the cache latch. Also, the memory device 100 may perform initialization on the cache latch and then receive data and a confirm command.

For example, referring to the first sub-command Sub 1, the memory device 100 may receive commands 7-1 and 7-2 and an address 7-3. For example, the memory device 100 may identify that the first sub-command Sub 1 is a multi-plane command (for performing the multi-plane program operation) based on 01h and 80h and may identify that the data to be input is LSB data (corresponding to the LSB page) based on 01h among the received commands. Also, the memory device 100 may identify which plane among the plurality of planes the data to be input is data to be stored in based on ADDR.

Also, the memory device 100 may initialize a cache latch included in a plane (e.g., the first plane) corresponding to the first sub command Sub 1 during the address cycle-to-data loading time tADL. Subsequently, the memory device 100 may receive data 7-4 and a confirm command 7-5.

Also, the memory device 100 may identify that a sequence of the first sub-command has been ended based on 11h as the confirm command 7-5. When the sequence of the first sub-command has been ended, the memory device 100 may move the data stored in the cache latch corresponding to the first sub-command Sub 1 to another latch connected to the same bit line BL.

Referring to the second sub-command Sub 2 and the third sub-command Sub 3, the memory device 100 may identify that the second sub-command Sub 2 is a multi-plane command (for performing the multi-plane program operation) based on 01h and 81h among received commands, and may identify that data to be input is not LSB data input for the first time among LSB data based on 81h among the received commands.

Referring to the fourth sub-command Sub 4, the memory device 100 may identify that input of LSB data to all planes which become a target of the multi-plane program operation has been ended, based on 22h among received commands. Also, the memory device 100 may identify that sub-commands corresponding to a next logical page are to be input, based on 22h.

Referring to fifth sub-command Sub 5, the memory device 100 may identify that data to be input is CSB data corresponding to the CSB page, based on 02h and 80h among received commands.

Referring to the ninth sub-command Sub 9, the memory device 100 may identify that data to be input is MSB data corresponding to an MSB page, based on 03h and 80h among received commands.

Referring to the twelfth sub-command Sub 12, the memory device 100 may identify that a sequence of the twelfth sub-command has been ended, based on 23h among received commands, and may perform a program operation of simultaneously storing data stored in the page buffer group 123 to a corresponding memory cell array.

Figure 8:
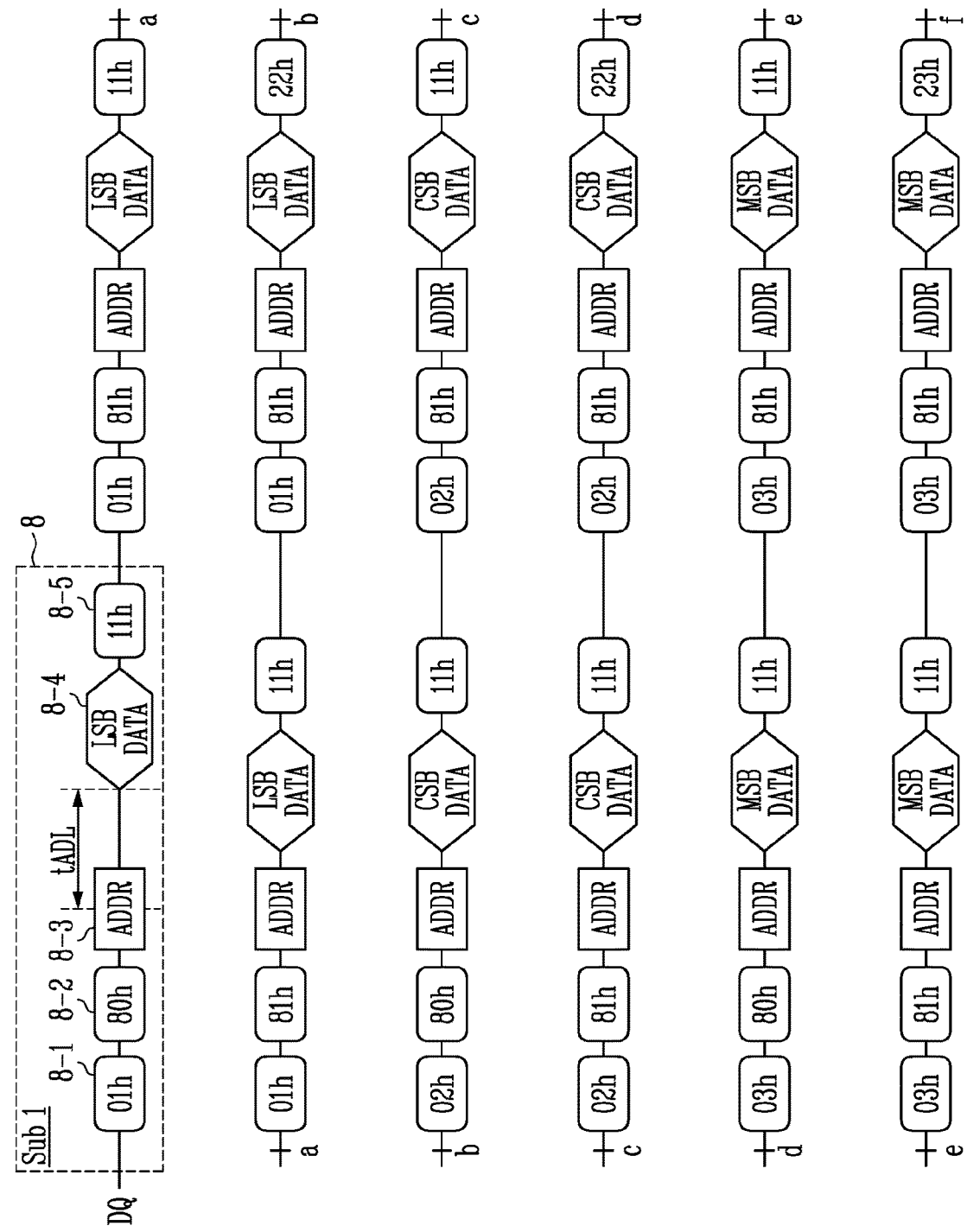
FIG. 8 illustrates an embodiment of a multi-plane program operation.

FIG. 8 is a diagram illustrating an embodiment of a multi-plane program operation. Referring to FIG. 8, a sequence of a multi-plane program operation is illustrated in which first to twelfth sub-commands are sequentially received. The sequence of the multi-plane program operation may not include any period in which a cache latch is initialized, e.g., any address cycle-to-data loading time tADL, except a period 8 corresponding to the first sub-command Sub 1.

In one embodiment, the memory device 100 may receive commands 8-1 and 8-2 and an address 8-3. The memory device 100 may identify that the first sub-command Sub 1 is a command for the multi-plane program operation by decoding the input commands, and may identify that the first sub-command Sub1 is a sub-command input for the first time (among a plurality of sub-commands) for the multi-plane program operation based on 01h and 80h as the received commands.

Also, the memory device 100 may perform an operation which includes initializing all cache latches in the memory device 100 during an address cycle-to-data loading time tADL of the first sub-command Sub 1. The memory device 100 may perform the initialization operation on all the cache latches and then receive LSB data 8-4 and a confirm command 8-5.

Subsequently, the memory device 100 may receive a command, an address, and data according to a sequence of the second to twelfth sub-commands Sub 2 to Sub 12. However, since the initialization operation on all the cache latches has been performed in the sequence of the first sub-command Sub 1, an initialization operation of a cache latch corresponding to each sub-command may be omitted in the sequence of the second to twelfth sub-commands Sub 2 to Sub 12.

Figure 9:
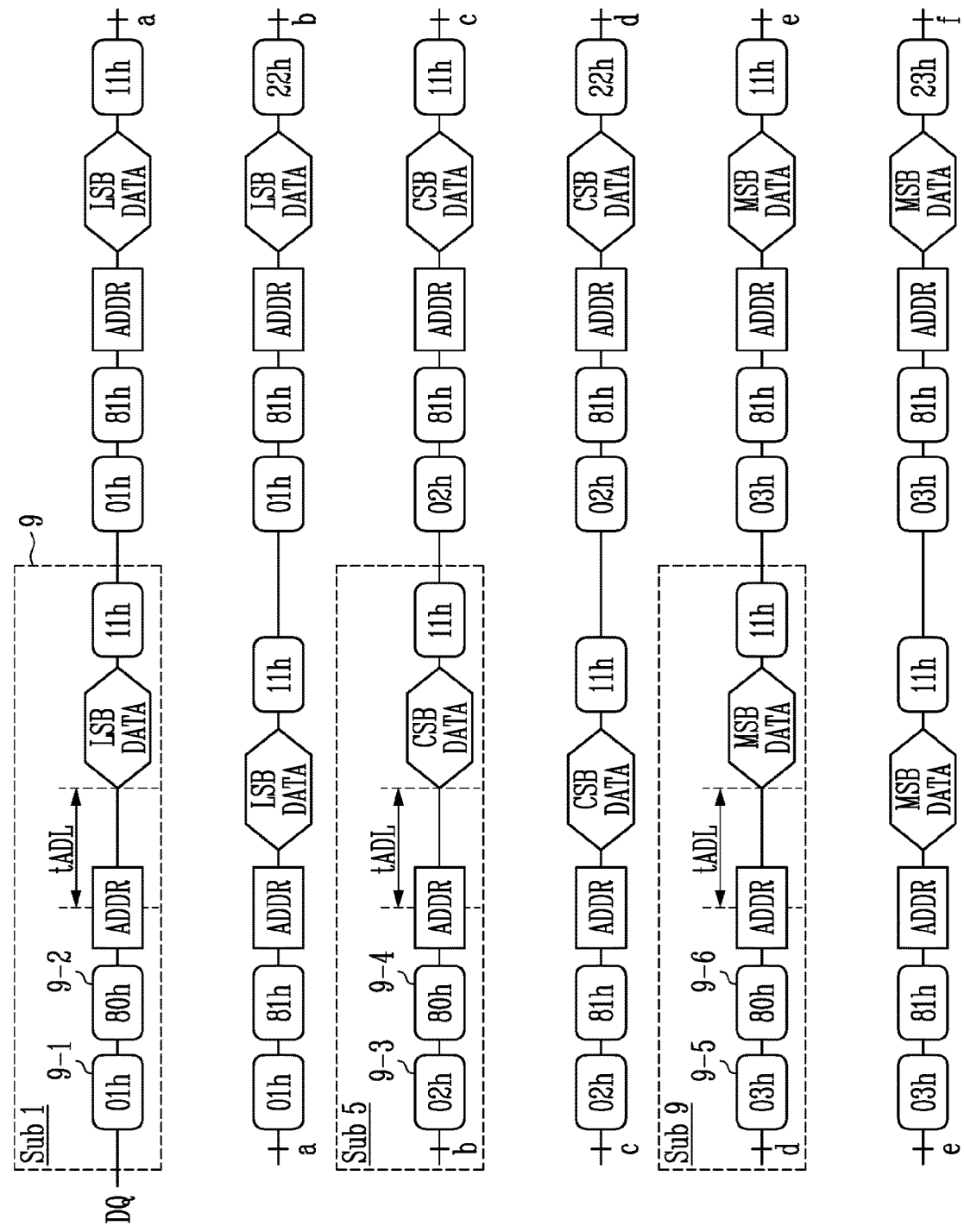
FIG. 9 illustrates an embodiment of a multi-plane program operation.

FIG. 9 is a diagram illustrating an embodiment of a multi-plane program operation. Referring to FIG. 9, a sequence of a multi-plane program operation is illustrated in which first to twelfth sub-commands are sequentially received. The sequence of the multi-plane program operation may not include any period in which a cache latch is initialized, e.g., any address cycle-to-data loading time tADL, except a period corresponding to the first sub-command Sub 1, the fifth sub-command Sub 5, and the ninth sub-command Sub 9.

In one embodiment, the memory device 100 may receive commands 9-1 and 9-2 in a sequence of the first sub-command Sub 1. The memory device 100 may identify that the first sub-command Sub 1 is a command for the multi-plane program operation by decoding the input commands, and may identify that the first sub-command Sub 1 is a sub-command corresponding to a logical page (e.g., LSB data) input for the first time (among a plurality of sub-commands) for the multi-plane program operation based on 01h and 80h as the received commands. Also, the memory device 100 may perform an operation which includes initializing all cache latches in the memory device 100 during an address cycle-to-data loading time tADL of the first sub-command Sub 1. The memory device 100 may perform the initialization operation on all the cache latches and then receive LSB data and a confirm command.

Subsequently, the memory device 100 may receive a command, an address, and data according to a sequence of the second to fourth sub-commands Sub 2 to Sub 4. However, since the initialization operation on all the cache latches has been performed in the sequence of the first sub-command Sub 1, an initialization operation of a cache latch (which corresponds to each sub-command) may be omitted in the sequence of the second to fourth sub-commands Sub 2 to Sub 4.

Also, the memory device 100 may receive commands 9-3 and 9-4 and an address in a sequence of the fifth sub-command Sub 5. The memory device 100 may identify that the fifth sub-command Sub 5 is a sub-command corresponding a logical page (e.g., CSB data) input for the first time (among the plurality of sub-commands) for the multi-plane program operation based on 02h and 80h as the received commands. Also, the memory device 100 may perform an operation which includes initializing all the cache latches in the memory device 100 during an address cycle-to-data loading time tADL of the fifth sub-command Sub 5. The memory device 100 may perform an initialization operation on all the cache latches and then receive CSB data and a confirm command.

Subsequently, the memory device 100 may receive a command, an address, and data according to a sequence of the sixth to eighth sub-commands Sub 6 to Sub 8. However, an initialization operation of a cache latch (which corresponds to each sub-command) may be omitted in the sequence of the sixth to eighth sub-commands Sub 6 to Sub 8.

Also, the memory device 100 may receive commands 9-5 and 9-6 and an address in a sequence of the ninth sub-command Sub 9. The memory device 100 may identify that the ninth sub-command Sub 9 is a sub-command corresponding to a logical page (e.g., MSB data) input for the first time (among the plurality of sub-commands) for the multi-plane program operation based on 03h and 80h as the received commands. Also, the memory device 100 may perform an operation which includes initializing all the cache latches in the memory device 100 during an address cycle-to-data loading time tADL of the ninth sub-command Sub 9. The memory device 100 may perform an initialization operation on all the cache latches and then receive MSB data and a confirm command.

Subsequently, the memory device 100 may receive a command, an address, and data according to a sequence of the tenth to twelfth sub-commands Sub 10 to Sub 12. However, an initialization operation of a cache latch (which corresponds to each sub-command) may be omitted in the sequence of the tenth to twelfth sub-commands Sub 10 to Sub 12.

Figure 10:
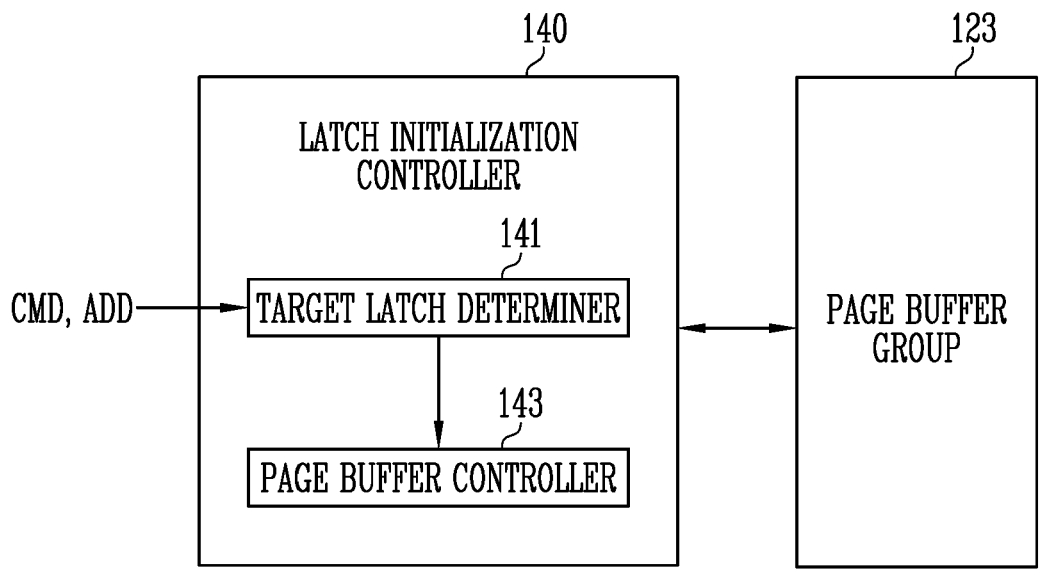
FIG. 10 illustrates an embodiment of a latch initialization controller.

FIG. 10 is a diagram illustrating an embodiment of operation of a latch initialization controller 140 shown with the page buffer group 123. The page buffer group 123 corresponds to any of the embodiments described herein.

Referring to FIG. 10, the latch initialization controller 140 may control the page buffer group 123 to perform an initialization operation of simultaneously initializing at least two cache latches (among cache latches) in response to a multi-plane program command. In one embodiment, the latch initialization controller 140 may include a target latch determiner 141 and a page buffer controller 143.

The target latch determiner 141 may determine a target latch on which the initialization operation is to be performed (among the cache latches) based on a plurality of sub-commands. For example, the target latch determiner 141 may decode sub-commands received from an external controller and may determine at least two cache latches (among the cache latches in the memory device 100) as the target latches of the initialization operation according to a sub-command.

The target latch determiner 141 may determine, as target latches, a cache latch directly corresponding to the sub-command and cache latches on which the initialization operation is to be simultaneously performed. For example, the target latch determiner 141 may determine, as target latches, a cache latch corresponding to a sub-command input for the first time and the other cache latches among the cache latches during an address cycle to data loading time tADL, which corresponds to the sub-command input for the first time. For example, the target latch determiner 141 may determine all the cache latches as target latches on which the initialization operation is to be performed during the address cycle-to-data loading time tADL, which corresponds to the sub-command input for the first time. Also, the target latch determiner 141 may transmit information on the determined target latch to the page buffer controller 143.

When the page buffer controller 143 receives the information on the target latch from the target latch determiner 141, the page buffer controller 143 may control the page buffer group by outputting page buffer control signals PBSIGNALS. The page buffer control signals PBSIGNALS may include, for example, the page data transmission signal TRANPB, the first bus signal CBUS_H_N, the second bus signal CBUS_L, the cache data transmission signal TRANC, and the cache reset signal CRST shown in FIG. 4B.

In one embodiment, the page buffer controller 143 may transmit the cache reset signal CRST to the page buffer group 123 in order to initialize the target latch determined by the target latch determiner 141. The page buffer controller 143 may control the page buffer group 123 to reset the cache latch by using the cache reset signal CRST.

Also, the page buffer controller 143 may control the page buffer group 123, using the page data transmission signal TRANPB and the cache data transmission signal TRANC, to move data stored in any one latch in the page buffer group 123 to another latch. For example, the page buffer controller 143 may control the page buffer group 123 to move data from the cache latch 1235 shown in FIG. 4A to one of the first to fourth latches 1231 to 1234 shown in FIG. 4A. In one embodiment, the page buffer controller 143 may control the page buffer group 123 to move data from one latch among the first to fourth latches 1231 to 1234 to other one of these latches.

Figure 11:
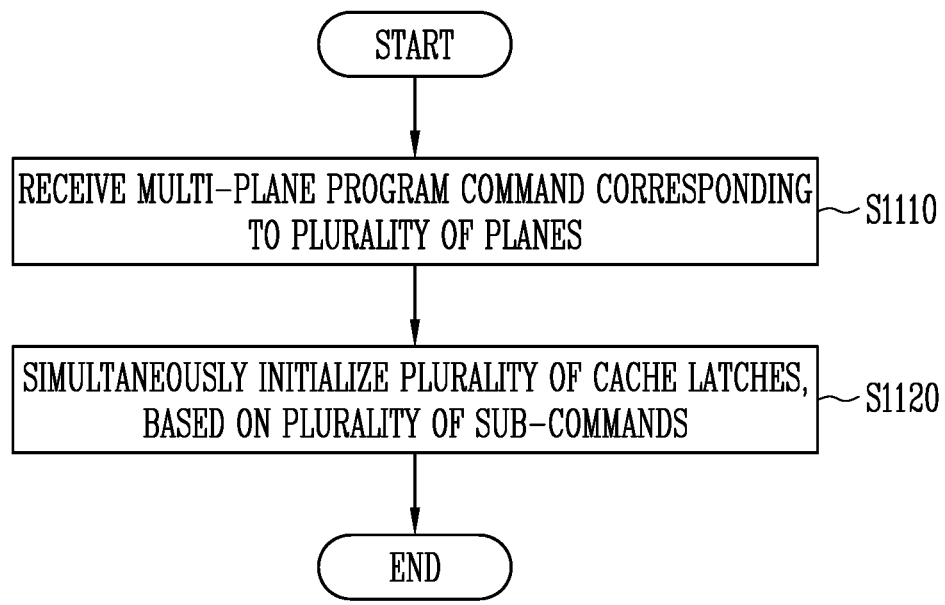
FIG. 11 illustrates an embodiment of a method of operating a memory device.

FIG. 11 is a flowchart illustrating an embodiment of a method of operating a memory device.

Referring to FIG. 11, first, the memory device 100 may receive a multi-plane program command corresponding to a plurality of planes (S1110). For example, the memory device 100 may receive, from an external controller, the multi-plane program command instructing a multi-plane program operation of simultaneously performing program operations respectively corresponding to the plurality of planes. In one embodiment, a multi-plane command may be configured with a plurality of sub-commands corresponding to each plane. In addition, each of the plurality of sub-commands may include information representing that the sub-command is a multi-plane command, logical page information representing which logical page among a plurality of logical pages data to be input corresponds to, and address information representing which plane among the plurality of planes data to be input is data to be stored in.

The memory device 100 may simultaneously initialize a plurality of cache latches based on the plurality of sub-commands (S1120). In one embodiment, the cache latch may be a latch which corresponds to each plane and which receives data to be stored in each plane. In one embodiment, the memory device 100 may determine at least two target latches on which initialization is to be performed (among the plurality of cache latches) based on the plurality of sub-commands. For example, the memory device 100 may determine all of the plurality of cache latches as target latches.

Also, the memory device 100 may simultaneously initialize the determined target latches. For example, the memory device 100 may initialize the target latches during a period corresponding to a sub-command input for the first time. In one embodiment, the memory device 100 may initialize at least two cache latches for every period corresponding to sub-commands each input for the first time for the respective logical pages.

Figure 12:
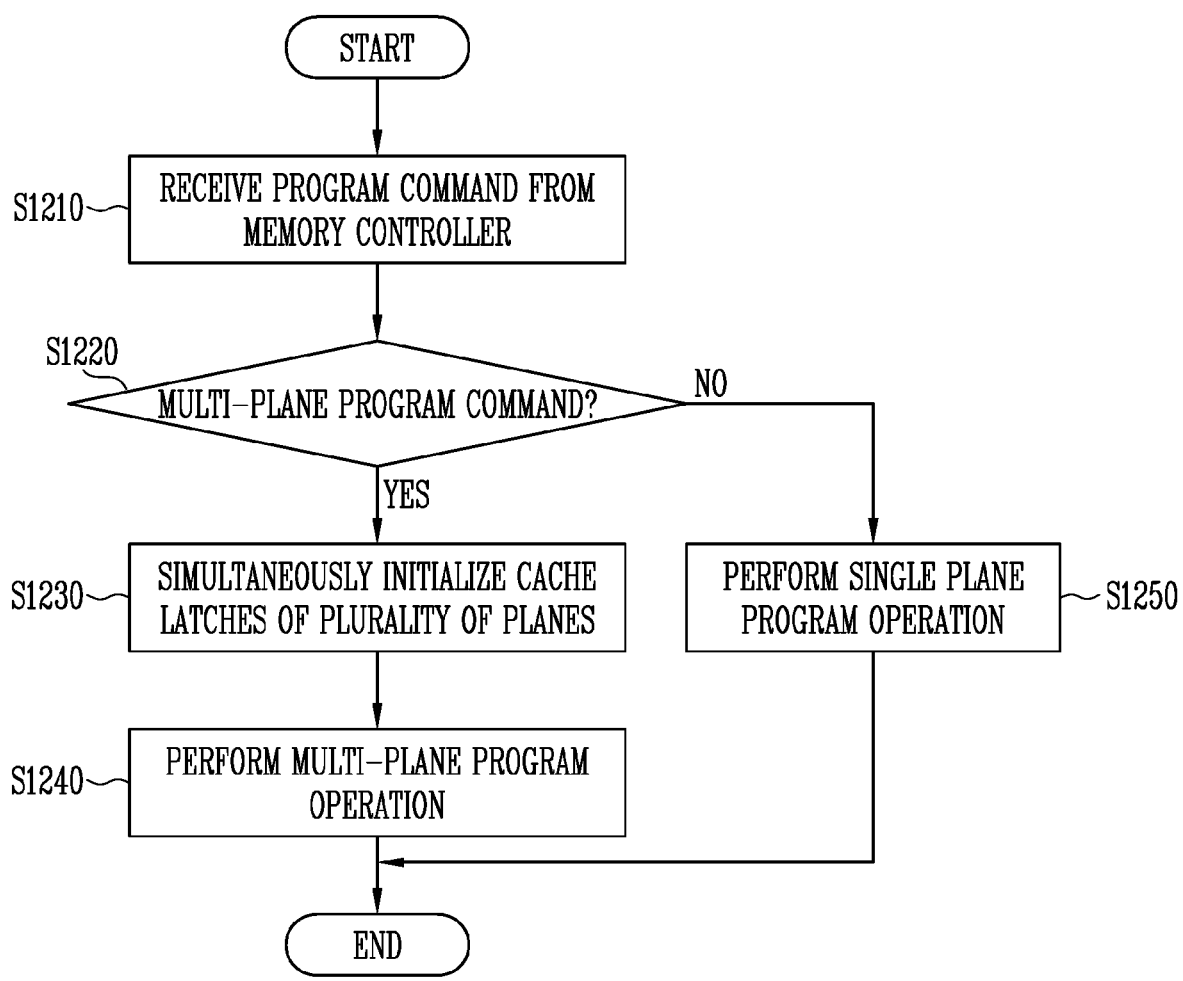
FIG. 12 illustrates an embodiment of a method of operating a memory device.

FIG. 12 is a flowchart illustrating an embodiment of a method of operating a memory device.

Referring to FIG. 12, the memory device 100 may receive a program command from the memory controller 200 (S1210). The memory controller 200 may transfer the program command to the memory device 100, in order to control the memory device 100 to perform a multi-plane program operation or to perform a single plane program operation.

Also, the memory device 100 may determine whether the program command received from the memory controller 200 is a multi-plane program command (S1220). The program command from the memory controller 200 may be transferred in an encoded form. In this case, the memory device 100 may decode the program command received from the memory controller 200 and may determine whether the corresponding program command is a multi-plane program command or a single plane program command. For example, as described in FIGS. 7 to 9, when 01h and 80h are included in the program command decoded by the memory device 100, the memory device 100 may identify that the corresponding program command is the multi-plane command for performing the multi-plane program operation.

When the corresponding program command is the multi-program command (S1220, Yes), the memory device 100 may simultaneously initialize cache latches of a plurality of planes (S1230). In one embodiment, the cache latch may be a latch which receives data to be stored in a memory cell. When an error occurs in the latch receiving the data, data different from that which the host 2000 intends to transfer may be stored. Therefore, the memory device may perform an operation of initializing the cache latch before the cache latch receives data.

In accordance with an embodiment, when a cache latch corresponding to one plane among the plurality of planes is initialized, the memory device 100 may simultaneously initialize cache latches corresponding to the other planes. For example, the memory device 100 may control a target latch to be initialized by transmitting the cache reset signal CRST to the corresponding target latch. In accordance with an embodiment, in a first address cycle to data loading time tADL (in which a cache latch of a first plane is initialized), the memory device 100 may transmit the cache reset signal CRST to the page buffer group 123 including the other cache latches so that the other cache latches are initialized. That is, the memory device 100 may transmit the cache reset signal CRST to each page buffer including cache latches so that all cache latches are simultaneously initialized.

Also, the memory device 100 may perform the multi-plane program operation (S1240). For example, when the memory device 100 simultaneously initializes the cache latches of the plurality of planes and receives the entire multi-plane program command configured with a plurality of sub-commands, the memory device 100 may perform the multi-plane program operation of simultaneously performing program operations respectively corresponding to the plurality of planes.

When the corresponding program command is not the multi-plane program command (S1220, No), the memory device 100 may initialize a cache latch of a corresponding plane and may perform the single plane program operation (S1250).

Figure 13:
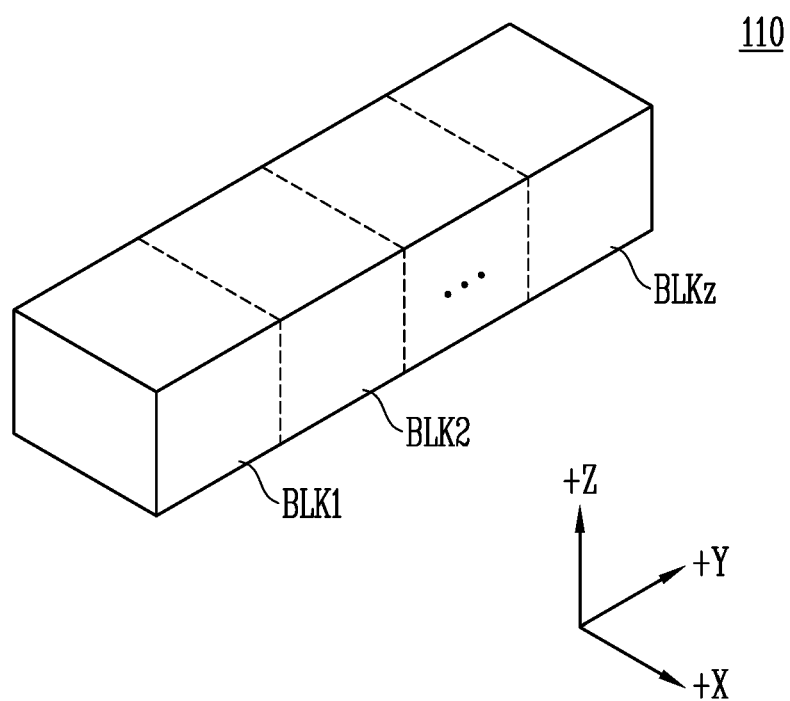
FIG. 13 illustrates an embodiment of a memory cell array.

FIG. 13 is a diagram illustrating an embodiment of a memory cell array 110 which may include a plurality of memory blocks BLK1 to BLKz. Each memory block may be formed in a three-dimensional structure and may include a plurality of memory cells stacked above a substrate. The plurality of memory cells may be arranged along +X, +Y, and +Z directions. A structure of each memory block will be described with reference to FIGS. 14 to 16.

Figure 14:
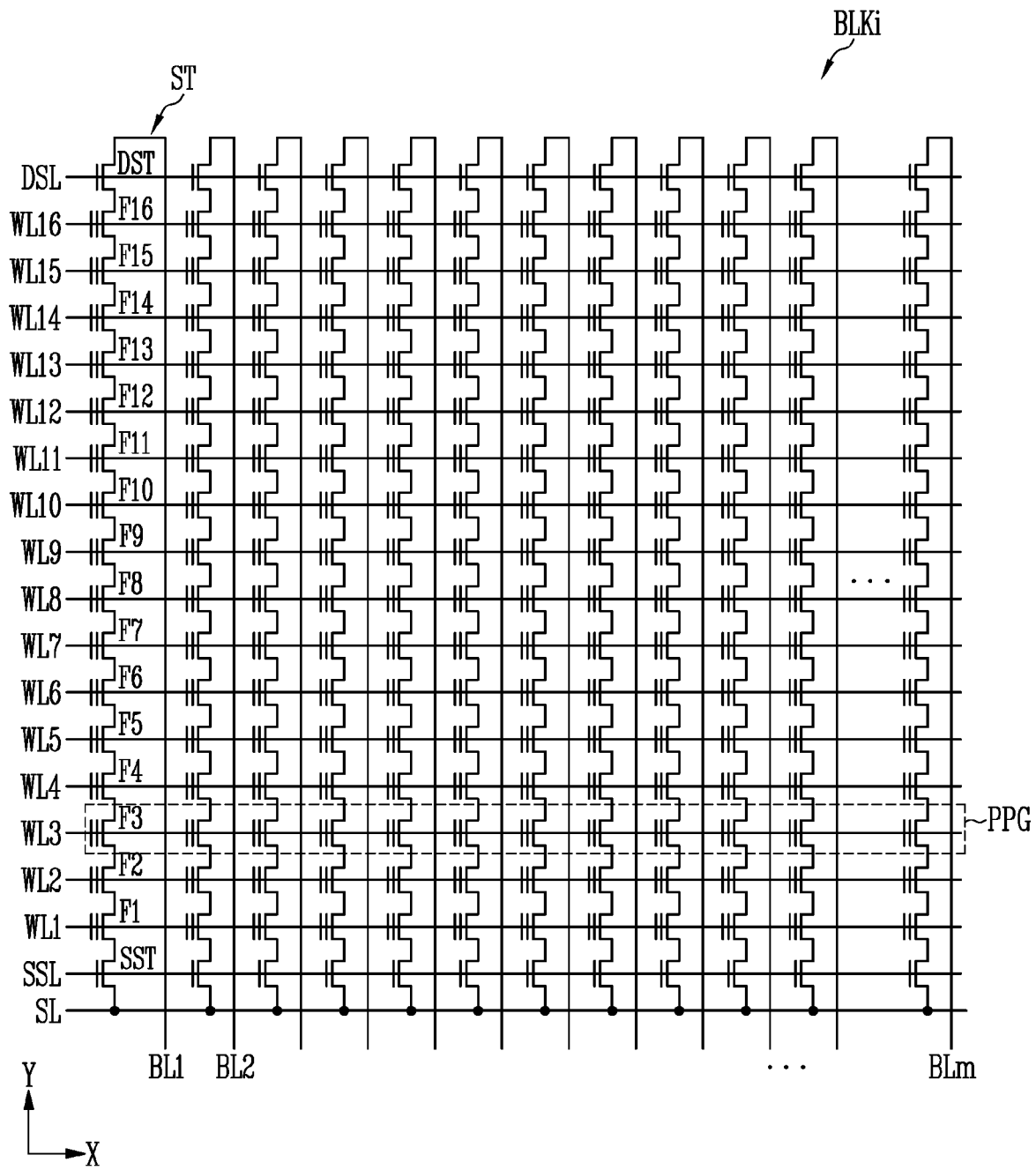
FIG. 14 illustrates an embodiment of a memory block.

FIG. 14 is a diagram illustrating an embodiment of a memory block BLKi, in which a plurality of word lines are arranged in parallel to each other and connected between a first select line and a second select line. The first select line may be a source select line SSL, and the second select line may be a drain select line DSL. For example, the memory block BLKi may include a plurality of strings ST connected between bit lines BL1 to BLm and a source line SL. The bit lines BL1 to BLm may be respectively connected to the strings ST, and the source line SL may be commonly connected to the strings ST. The strings ST may be configured identically to one another, and therefore a string ST connected to a first bit line BL1 will be described as an example.

The string ST may include a source select transistor SST, a plurality of memory cells F1 to F16, and a drain select transistor DAT connected in series to each other between the source line SL and the first bit line BL1. At least one source select transistor SST and at least one drain select transistor DST may be included in one string ST. In one embodiment, a number of memory cells greater than that of memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST in different strings ST may be connected to the source select line SSL. Gates of drain select transistors DST in different strings ST may be connected to the drain select line DSL. Gates of the memory cells F1 to F16 may be connected to a plurality of word lines WL1 to WL16. A group of memory cells connected to the same word line (among memory cells in different strings ST) may be referred to as a physical page PPG. Therefore, physical pages PPG corresponding to the number of the word lines WL1 to WL16 may be in the memory block BLKi.

Each of the memory cells may be configured, for example, as a Single Level Cell (SLC) storing one data bit, a Multi-Level Cell (MLC) storing two data bits, a Triple Level Cell (TLC) storing three data bits, or a Quad Level Cell (QLC) storing four data bits.

The SLC may store one-bit data. One physical page PG of the SLC may store one logical page (LPG) data. The one LPG data may include data bits of which number corresponding to that of memory cells in the one physical page PG. The MLC, the TLC, and the QLC may store two or more-bit data. One physical page PG may store two or more LPG data.

Figure 15:
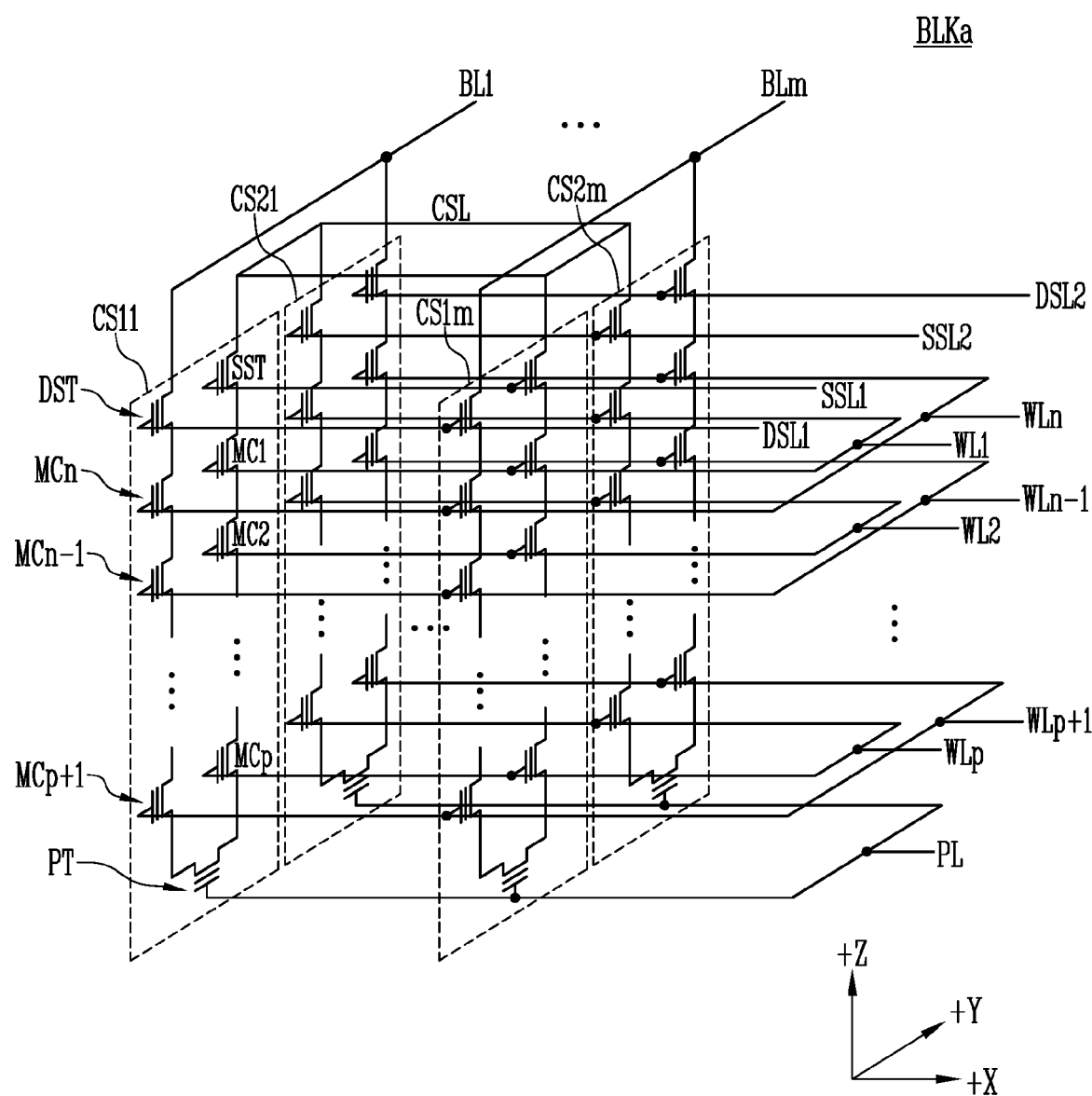
FIG. 15 illustrates an embodiment of a memory block.

FIG. 15 is a diagram illustrating an embodiment of a memory block BLKa which may be representative of memory blocks BLK1 to BLKz. The memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (e.g., a +X direction). Although a case where two cell strings arranged in a column direction (e.g., a +Y direction) is illustrated in FIG. 15, this is for convenience of description and it will be apparent that a different number of (e.g., three) cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST. The select transistors SST and DST and the memory cells MC1 to MCn may have structures similar to one another.

In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp. In an embodiment, the source select transistors of cell strings arranged on the same row are connected to a source select line extending in the row direction. The source select transistors of cell strings arranged on different rows are connected to different source select lines. Referring to FIG. 15, the source select transistors of the cell strings CS11 to CS1$m$ on a first row are connected to a first source select line SSL1. The source select transistors of the cell strings CS21 to CS2$m$ on a second row are connected to a second source select line SSL2. In another embodiment, the source select transistors of the cell strings CS11 to CS1$m$ and CS21 to CS2$m$ may be commonly connected to one source select line.

The first to nth memory cells MC1 to MCn of each cell string are connected between the source select transistor SST and the drain select transistor DST. The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1$m$ on the first row are connected to a first drain select line DSL1. The drain select transistors of the cell strings CS21 to CS2$m$ on the second row are connected to a second drain select line DSL2.

Cell strings arranged in the column direction are connected to a bit line extending in the column direction. Referring to FIG. 15, the cell strings CS11 and CS21 on a first column are connected to a first bit line BL1. The cell strings CS1$m$ and CS2$m$ on an mth column are connected to an mth bit line BLm.

Memory cells connected to the same word line in the cell strings arranged in the row direction constitute one page. For example, memory cells connected to the first word line WL1 in the cell strings CS11 to CS1$m$ on the first row constitute one page. Memory cells connected to the first word line WL1 in the cell strings CS21 to CS2$m$ on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1$m$ or CS21 to CS2$m$ arranged in the row direction may be connected to the even bit lines, respectively. Odd-numbered cell strings among the cell strings CS11 to CS1$m$ or CS21 to CS2$m$ arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. In one embodiment, the at least one dummy memory cell may be provided to decrease an electric field between the drain select transistor DST and the memory cells MCp+1 to MCn. When the number of dummy memory cells increases, the reliability of an operation of the memory block BLKa is improved, but the size of the memory block BLKa increases. When the number of dummy memory cells decreases, the size of the memory block BLKa decreases but the reliability of an operation of the memory block BLKa may be deteriorated.

In order to efficiently control the at least one dummy memory cell, the dummy memory cells may have a predetermined threshold voltage. Before or after an erase operation of the memory block BLKa, a program operation may be performed on all or some of the dummy memory cells. When an erase operation is performed after the program operation, the threshold voltage of the dummy memory cells control a voltage applied to the dummy word lines connected to respective ones of the dummy memory cells, so that the dummy memory cells can have the predetermined threshold voltage.

Figure 16:
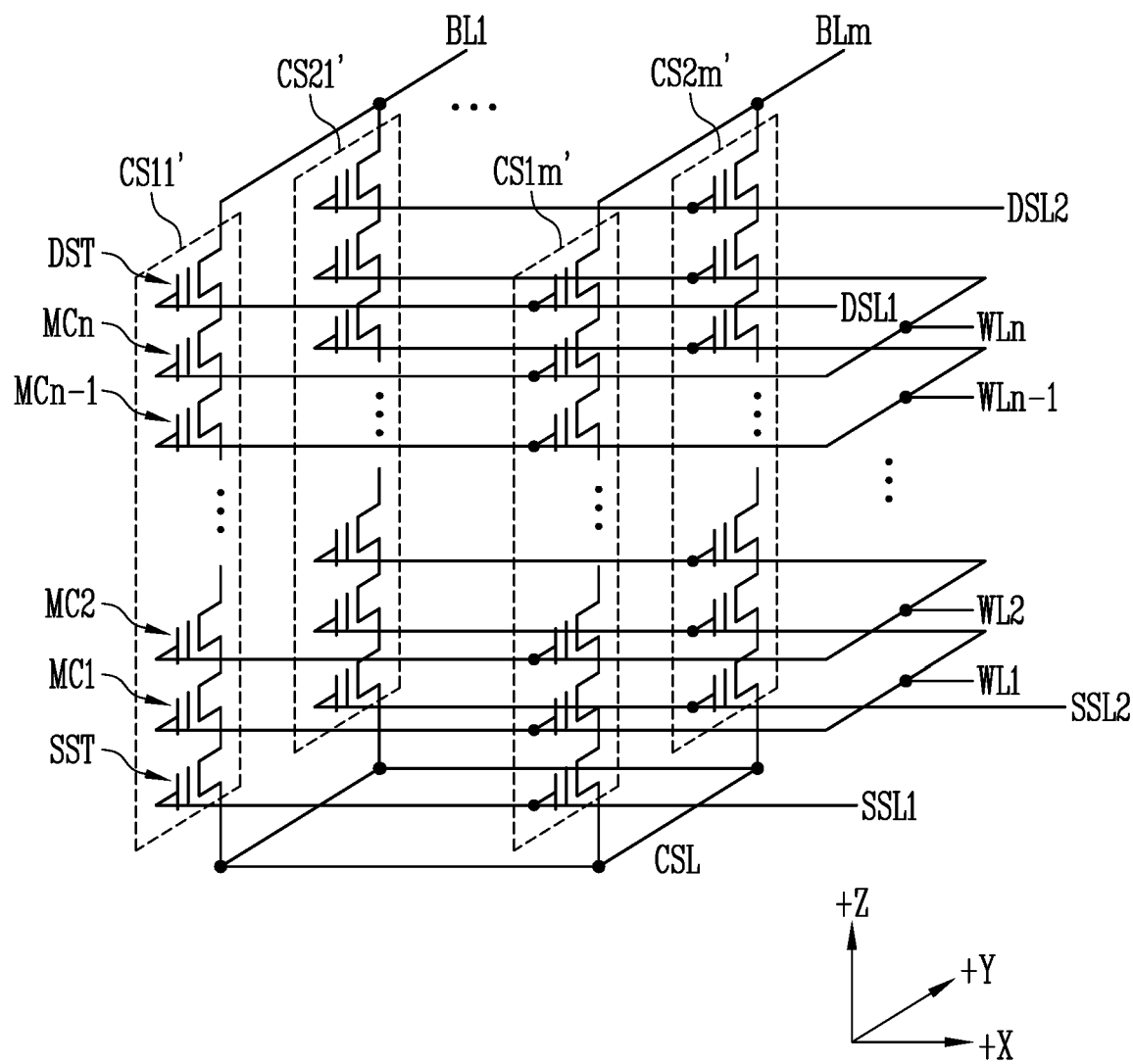
FIG. 16 illustrates an embodiment of a memory block.

FIG. 16 is a diagram illustrating an embodiment of a memory block BLKb, which may be representative of the memory blocks BLK1 to BLKz shown in FIG. 13. The memory block BLKb may include a plurality of cell strings CS11' to CS1m' and CS21' to CS2m'. Each of the plurality of cell strings CS11' to CS1m' and CS21' to CS2m' extends along the +Z direction and includes at least one source select transistor SST, first to nth memory cells MC1 to MCn, and at least one drain select transistor DST stacked on a substrate under the memory block BLKb.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line 55L2. In one embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

As a result, the memory block BLKb of FIG. 16 may have a circuit similar to that of the memory block BLKa of FIG. 15, except that the pipe transistor PT is excluded from each cell string in FIG. 16.

In one embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively. Odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease the strength of an electric field between the source select transistor SST and the memory cells MC1 to MCp. In one embodiment, the at least one dummy memory cell may be provided to decrease an electric field between the drain select transistor DST and the memory cells MCp+1 to MCn. When the number of dummy memory cells increases, the reliability of operation of the memory block BLKb is improved but the size of the memory block BLKb is increased. When the number of dummy memory cells decreases, the size of the memory block BLKb decreases but the reliability of operation of the memory block BLKb may be deteriorated.

In order to efficiently control the at least one dummy memory cell, the dummy memory cells may have a predetermined threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the predetermined threshold voltage.

Figure 17:
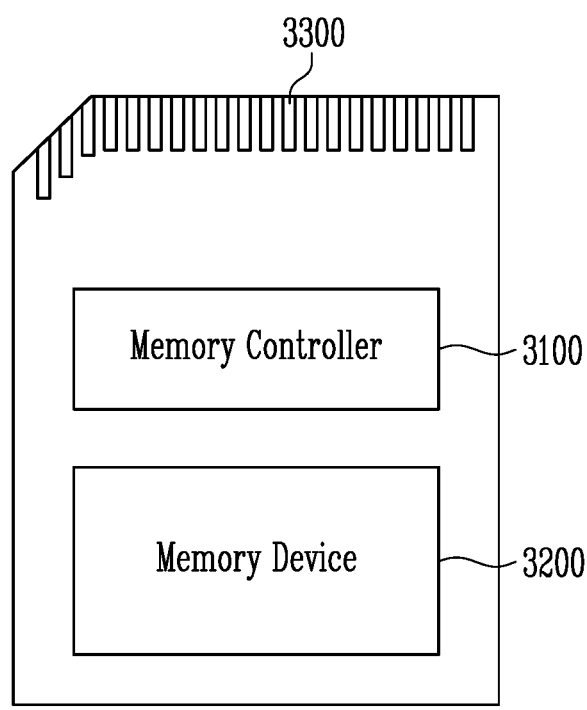
FIG. 17 illustrates an embodiment of a memory card system.

FIG. 17 is a diagram illustrating an embodiment of a memory card system 3000, which includes a memory controller 3100, a memory device 3200, and a connector 3300.

Referring to FIG. 17, the memory controller 3100 may be connected to and access the memory device 3200. The memory controller 3100 may control, for example, operations including read, write, erase, and background operations on the memory device 3200. The memory controller 3100 may serve as an interface between the memory device 3200 and a host. Also, the memory controller 3100 may drive instructions (e.g., firmware) for controlling the memory device 3200.

The memory controller 3100 may include components such as a Random Access Memory (RAM), a processing unit, a host interface, a memory interface, and the error corrector 233.

The memory controller 3100 may communicate with an external device through the connector 3300. The memory controller 3100 may communicate with the external device (e.g., the host) according to a specific communication protocol, standard, or interface. Examples of the protocol, standard, or interface include a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

The memory device 3200 may be implemented as a nonvolatile memory device. Examples include an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

In one embodiment, the memory controller 3100 and the memory device 3200 may be integrated into a single semiconductor device, in order to constitute a memory card. Examples of such a memory card include a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 18:
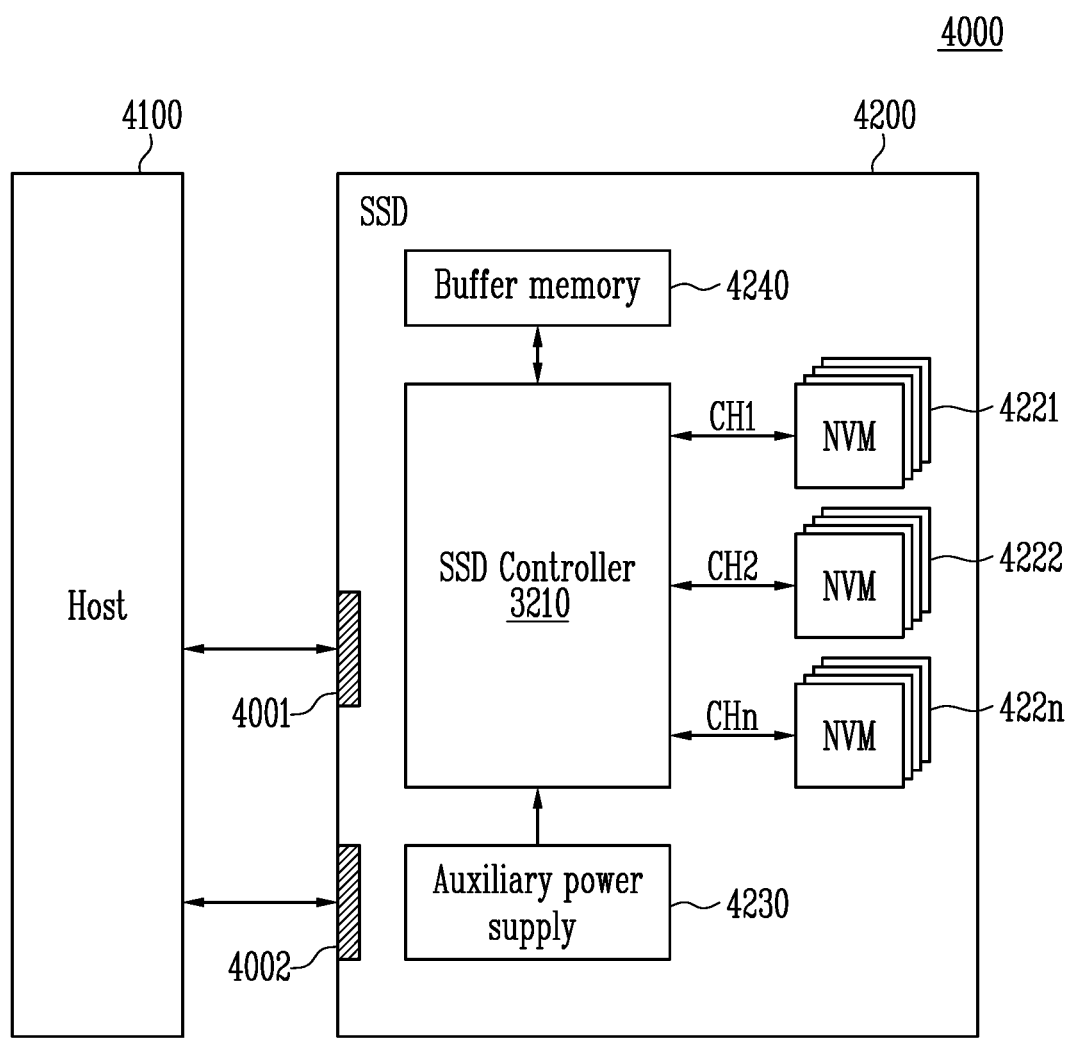
FIG. 18 illustrates an embodiment of a Solid State Drive (SSD).

FIG. 18 is a diagram illustrating an embodiment of a Solid State Drive (SSD) system 4000, which includes a host 4100 and an SSD 4200. The SSD 4200 exchanges a signal SIG with the host 4100 through a signal connector 4001 and receives power PWR through a power connector 4002. The SSD 4200 includes an SSD controller 4210, a plurality of flash memories 4221 to 422n, an auxiliary power supply 4230, and a buffer memory 4240.

In an embodiment, the SSD controller 4210 may serve as the memory controller 200 described with reference to FIG. 1. The SSD controller 4210 may control the plurality of flash memories 4221 to 422n in response to a signal SIG received from the host 4100. The signal SIG may be a signal based on at least one interface between the host 4100 and the SSD 4200. Examples of the interface include a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth (e.g., does not conform to a predetermined level or pattern), the auxiliary power supply 4230 may provide power to the SSD 4200. The auxiliary power supply 4230 may be located, for example, in the SSD 4200 or may be located outside SSD 4200. In one embodiment, the auxiliary power supply 4230 may be on a main board to provide auxiliary power to the SSD 4200.

The buffer memory 4240 may operate as a buffer memory of the SSD 4200. For example, the buffer memory 4240 may temporarily store data received from the host 4100 or data received from the plurality of flash memories 4221 to 422n, or may temporarily store meta data (e.g., a mapping table) of the flash memories 4221 to 422n. The buffer memory 4240 may include a volatile memory (e.g., a DRAM, an SDRAM, a DDR SDRAM, an LPDDR SDRAM, and a GRAM) or a nonvolatile memory such as a FRAM, a ReRAM, an STT-MRAM, and a PRAM.

Figure 19:
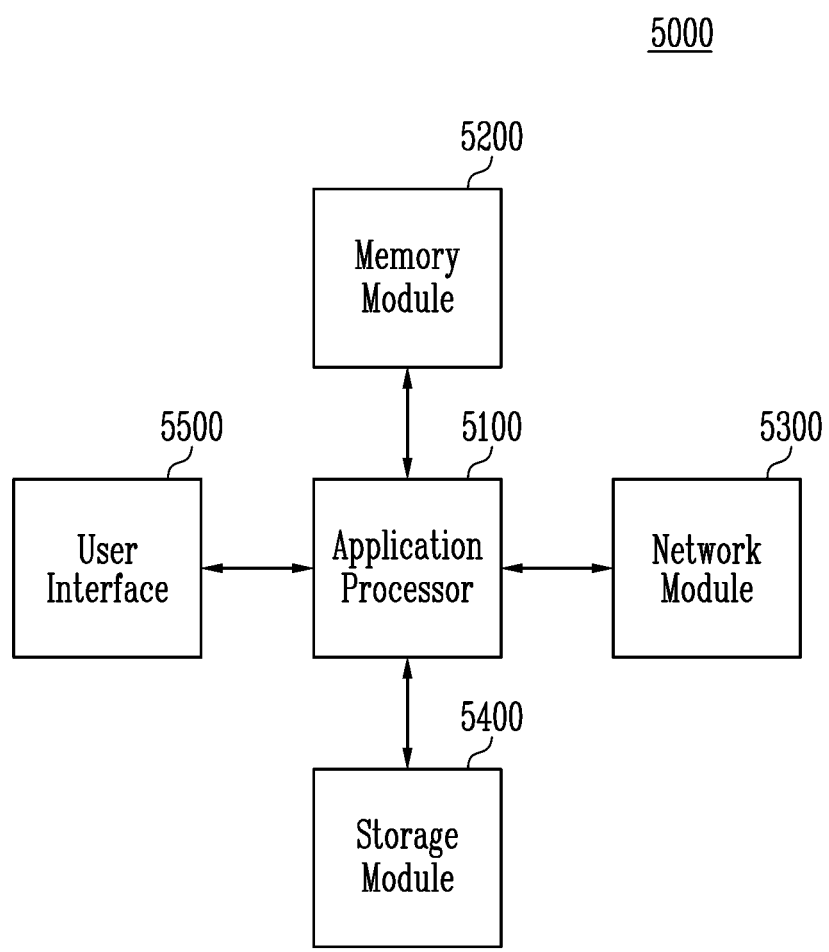
FIG. 19 illustrates an embodiment of a user system.

FIG. 19 is a diagram illustrating an embodiment of a user system 5000, which includes an application processor 5100, a memory module 5200, a network module 5300, a storage module 5400, and a user interface 5500. The application processor 5100 may drive components in the user system 5000, an operating system (OS), a user program, and/or other features. The application processor 5100 may include one or more controllers which, for example, control components in the user system 5000, interfaces, a graphic engine, and/or other features. In one embodiment, the application processor 5100 may be provided as a System-on-Chip (SoC).

The memory module 5200 may operate as a main memory, working memory, buffer memory or cache memory of the user system 5000. The memory module 5200 may include a volatile random access memory (e.g., a DRAM, an SDRAM, a DDR SDRAM, a DDR2 SDRM, a DDR3 SDRAM, an LPDDR SDRAM, an LPDDR2 SDRAM, and an LPDDR3 SDRAM) or a nonvolatile random access memory such as a PRAM, a ReRAM, an MRAM, and a FRAM. In one embodiment, the application processor 5100 and the memory module 5200 may be provided as one semiconductor package, e.g., Package on Package (PoP).

The network module 5300 may communicate with external devices, and in one embodiment may support wireless communications. Examples include Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 5300 may be included, for example, in the application processor 5100 or another location.

The storage module 5400 may store data received, for example, from the application processor 5100. In one embodiment, the storage module 5400 may transmit data stored therein to the application processor 5100. The storage module 5400 may be implemented, for example as a nonvolatile semiconductor memory device, such as a Phase-change RAM (PRAM), a Magnetic RAM (MRAM), a Resistive RAM (RRAM), a NAND flash, a NOR flash, or a NAND flash having a three-dimensional structure. In one embodiment, the storage module 5400 may be provided as a removable drive (e.g., a memory card) of the user system 5000 or as an external drive.

In one embodiment, the storage module 5400 may include a plurality of nonvolatile memory devices. The plurality of nonvolatile memory devices may operate identically to the memory device described with reference to FIGS. 1 to 11. The storage module 5400 may operate identically to the storage device 1000 described with reference to FIG. 1.

The user interface 5500 may include interfaces for inputting data or commands to the application processor 5100 or for outputting data to an external device. Examples of user input interfaces include a keyboard, a keypad, a button, a touch panel, a touch screen, a touch pad, a touch ball, a camera, a microphone, a gyroscope sensor, a vibration sensor and a piezoelectric element. Examples of user output interfaces include a Liquid Crystal Display (LCD), an Organic Light Emitting Diode (OLED) display device, an Active Matrix OLED (AMOLED) display device, an LED, a speaker, and a monitor.

In accordance with one or more of the aforementioned embodiments, a memory device is provided to have improved program operation speed. Additional embodiments provide a method for operating a memory device to have improved program operation speed.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, handlers, units, multiplexers, schedulers, generators, latches, logic, determiners, interfaces, decoders, drivers, modules, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. Embodiments may be combined to form additional embodiments.

What is claimed is:

1. A memory device comprising:
a plurality of memory cells grouped into a plurality of planes;
page buffer groups corresponding to respective ones of the plurality of planes, the page buffer groups including a plurality of page buffer circuits, each of the plurality of page buffer circuits including cache latches which are configured to receive data to be stored in memory cells in the plurality of planes; and
control logic configured to control the page buffer groups to simultaneously initialize at least two cache latches corresponding to at least two planes, among the cache latches, in response to a multi-plane program command, wherein the multi-plane program command instructs a multi-plane program operation of simultaneously storing data in plural planes among the plurality of planes.

2. The memory device of claim 1, wherein
the data includes a plurality of logical data corresponding to a plurality of logical pages, and
the multi-plane program command includes a plurality of sub-commands corresponding to respective ones of the plurality of logical data.

3. The memory device of claim 2, wherein the plurality of sub-commands include logical page information representing which logical page among the plurality of logical pages the data corresponds to.

4. The memory device of claim 2, wherein the plurality of logical pages include a Most Significant Bit (MSB) page, a Center Significant Bit (CSB) page, and a Least Significant Bit (LSB) page.

5. The memory device of claim 1, wherein
the plurality of planes include first to fourth planes, and
the page buffer groups are configured to sequentially receive the data from an external controller in a sequence of the first to fourth planes.

6. The memory device of claim 1, wherein the multi-plane program command includes address information representing which plane among the plurality of planes the data is data to be stored in.

7. The memory device of claim 2, wherein the control logic includes a latch initialization controller configured to control the page buffer groups to perform an initialization operation of simultaneously initialize the at least two cache latches in response to the multi-plane program command.

8. The memory device of claim 7, wherein the latch initialization controller includes a page buffer controller configured to control the page buffer groups to move data stored in one latch to another latch in response to input of one sub-command among the plurality of sub-commands.

9. The memory device of claim 8, wherein the page buffer controller is configured to control the page buffer groups to move data stored in at least one cache latch among the cache latches to another latch connected to the at least one cache latch through a same bit line.

10. The memory device of claim 7, wherein the latch initialization controller includes a target latch determiner configured to determine at least two target latches on which the initialization operation is to be performed among the cache latches, based on the plurality of sub-commands.

11. The memory device of claim 2, wherein the control logic is configured to control the page buffer groups to initialize the at least two cache latches during a period corresponding to a sub-command input for a first time among the plurality of sub-commands.

12. The memory device of claim 11, wherein the control logic is configured to control the page buffer groups to initialize all the cache latches during the period corresponding to the sub-command input for the first time.

13. The memory device of claim 2, wherein the control logic is configured to control the page buffer groups to initialize the at least two cache latches for every period corresponding to sub-commands each input for a first time for the respective logical pages.

14. A method for operating a memory device including a plurality of planes, the method comprising:
receiving, from an external controller, a multi-plane program command instructing a multi-plane program operation and including a plurality of sub-commands, wherein the multi-plane program operation includes simultaneously performing program operations corresponding to respective ones of the plurality of planes; and simultaneously initializing, based on the plurality of sub-commands, a plurality of cache latches corresponding to the plurality of planes, wherein the plurality of cache latches are configured to receive data to be stored in each of the plurality of planes.

15. The method of claim 14, wherein the initializing of the plurality of cache latches includes:

determining at least two target latches on which initialization is to be performed among the plurality of cache latches, based on the plurality of sub-commands; and simultaneously initializing the at least two target latches.

16. The method of claim 15, wherein the simultaneously initializing of the at least two target latches include initializing the at least two target latches during a period corresponding to a sub-command input for a first time.

17. The method of claim 16, wherein the determining of the at least two target latches include determining all of the plurality of cache latches as the target latches.

18. The method of claim 15, wherein:

the data includes a plurality of logical data corresponding to a plurality of logical pages;

the multi-plane program command includes a plurality of sub-commands corresponding to respective ones of the plurality of logical data; and the plurality of sub-commands include logical page information representing which logical page among the plurality of logical pages the data corresponds to.

19. The method of claim 15, wherein the simultaneously initializing of the at least two target latches includes initializing the at least two target latches for every period corresponding to sub-commands each input for a first time for the respective logical pages.

20. A memory device comprising:

a plurality of planes including memory cells;

page buffer groups corresponding to respective ones of the plurality of planes, each of the page buffer groups being configured to receive data to be stored in the memory cells; and control logic configured to receive a multi-plane program command for simultaneously performing program operations on the plurality of planes, and control the page buffer groups to simultaneously initialize all latches included in the page buffer groups while receiving data to be stored in one plane among the plurality of planes.

\* \* \* \* \*